(12) United States Patent
Chen et al.

(10) Patent No.: US 12,178,006 B2
(45) Date of Patent: Dec. 24, 2024

(54) MICROCHANNEL HEAT SINK DEVICE

(71) Applicant: Advanced Liquid Cooling Technologies Inc., Anderson, SC (US)

(72) Inventors: Nan Chen, Templestowe (AU); He Zhao, Flagstaff Hill (AU); Yunshui Chen, San Ramon, CA (US)

(73) Assignee: Advanced Liquid Cooling Technologies Inc., Anderson, SC (US)

( * ) Notice: Subject to any disclaimer, the term of this patent is extended or adjusted under 35 U.S.C. 154(b) by 0 days.

(21) Appl. No.: 17/487,000

(22) Filed: Sep. 28, 2021

(65) Prior Publication Data

US 2022/0418155 A1    Dec. 29, 2022

Related U.S. Application Data

(63) Continuation-in-part of application No. 17/360,003, filed on Jun. 28, 2021.

(51) Int. Cl.
  *F28F 3/12*    (2006.01)
  *F28F 3/04*    (2006.01)
  *H05K 7/20*    (2006.01)

(52) U.S. Cl.
  CPC ..... *H05K 7/20254* (2013.01); *H05K 7/20281* (2013.01); *F28F 3/12* (2013.01)

(58) Field of Classification Search
  CPC ..... F28F 3/12; F28F 3/048; F28D 2021/0029; H05K 7/20809
  See application file for complete search history.

(56) References Cited

U.S. PATENT DOCUMENTS

| | | | |
|---|---|---|---|
| 7,331,380 B2* | 2/2008 | Ghosh | H01L 23/473 165/125 |
| 2007/0030655 A1* | 2/2007 | Bhatti | H01L 23/4336 257/E23.093 |

* cited by examiner

*Primary Examiner* — Lionel Nouketcha
(74) *Attorney, Agent, or Firm* — Nutter, McClennen & Fish, LLP

(57) ABSTRACT

A device including a microchannel heat sink having a first layer circle A and circle B fins and a second layer circle A and circle B fins, wherein circle A fins includes a plurality of outer ring fins and circle B fins includes a plurality of inner ring fins; a cover assembly, in which the cover assembly includes adaptors, a liquid channel, a vapor channel, and a TRV chamber; a thermal regulation valve (TRV), wherein the thermal regulation valve (TRV) is configured to enable dynamic responses for temperature control in the microchannel heat sink; and a temperature sensing mechanism, in which the temperature sensing mechanism is configured to be operable for detecting temperature variations and converting the temperature variations to pressure variations.

20 Claims, 13 Drawing Sheets

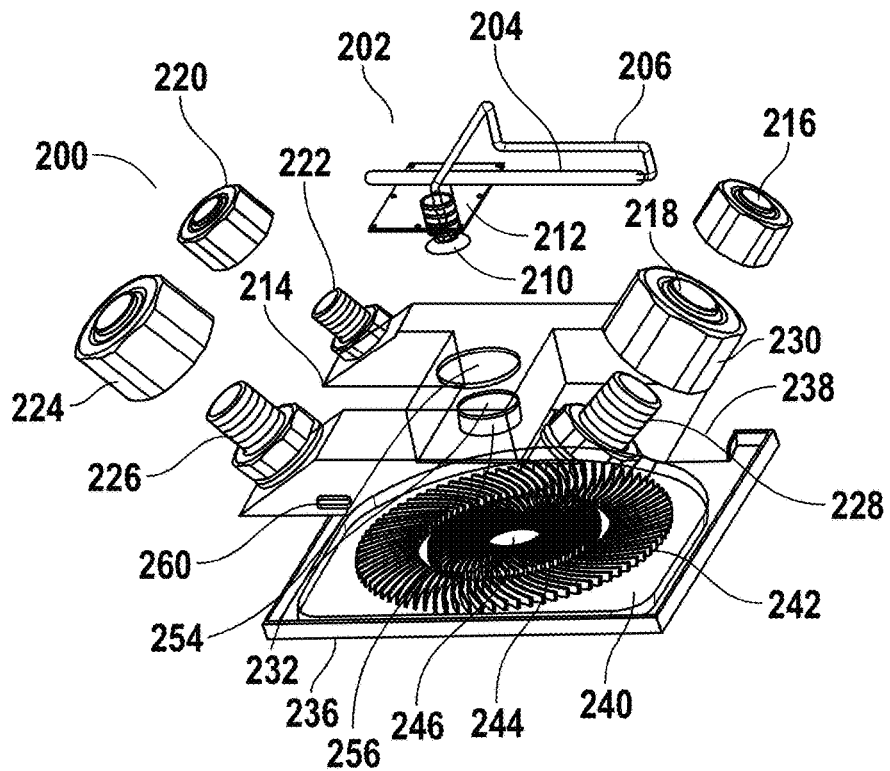
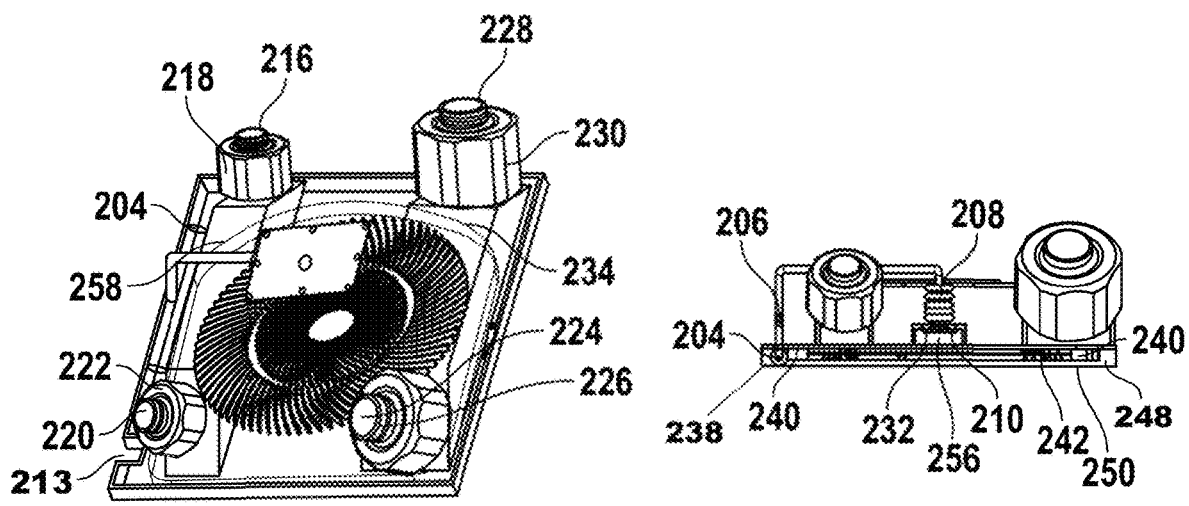
FIG. 2A
FIG. 2B  FIG. 2C

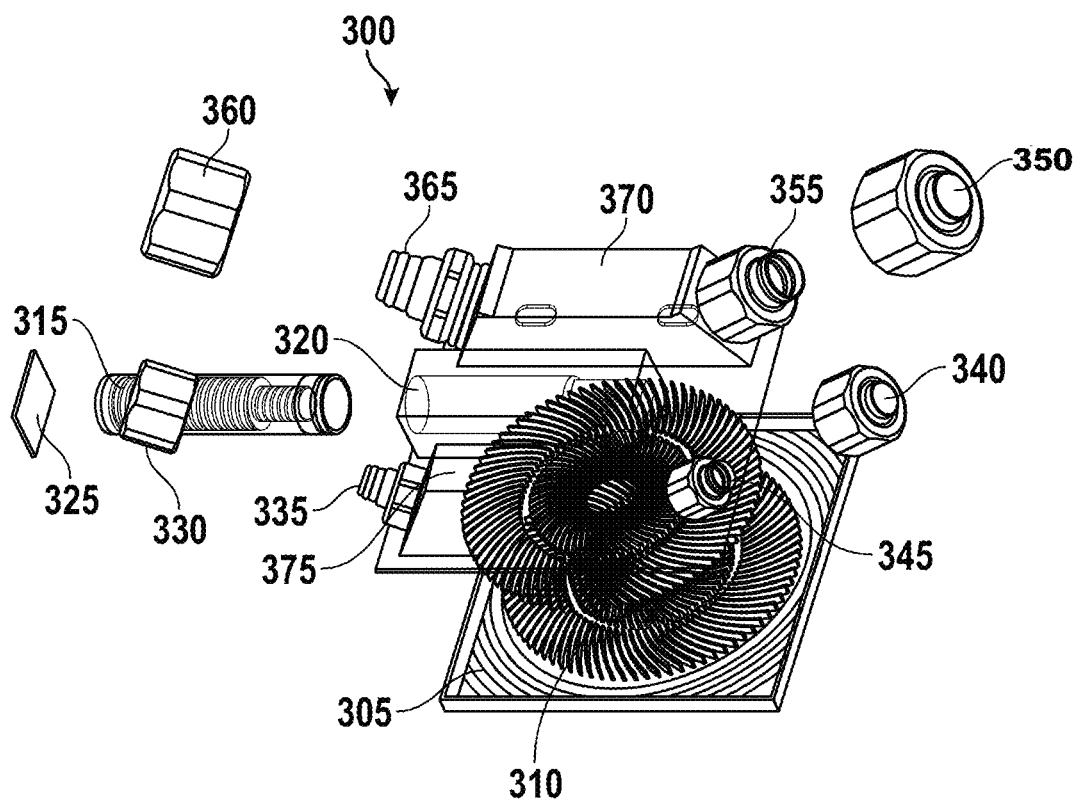
FIG. 3A
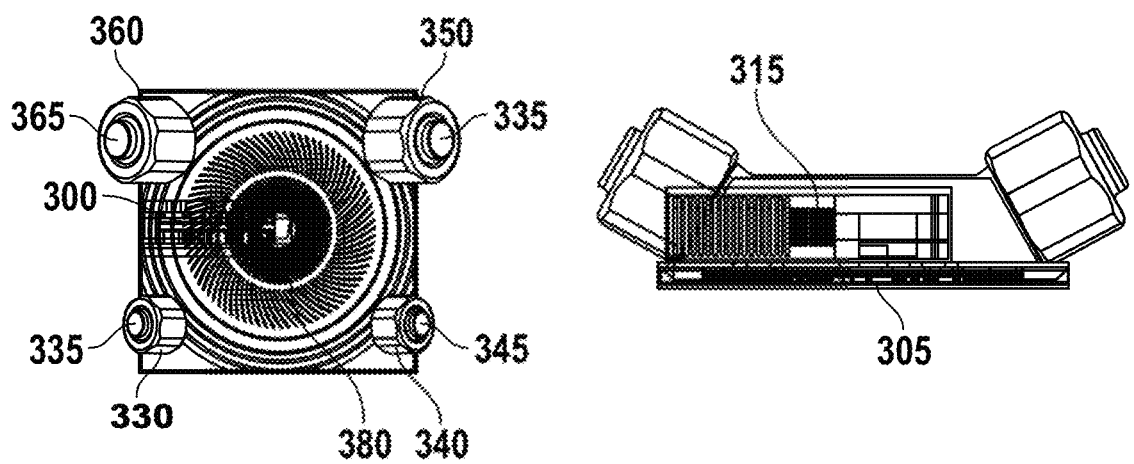
FIG. 3B
FIG. 3C

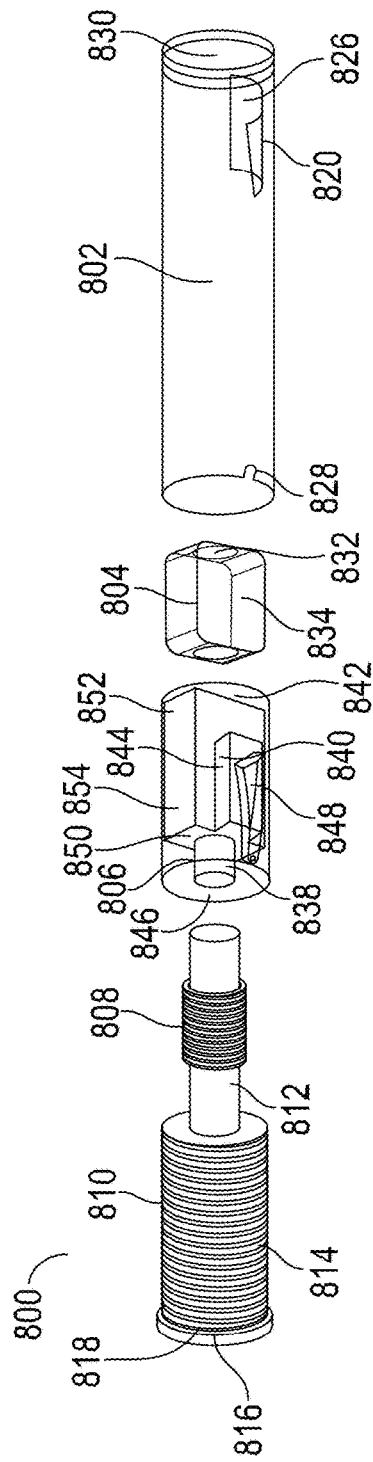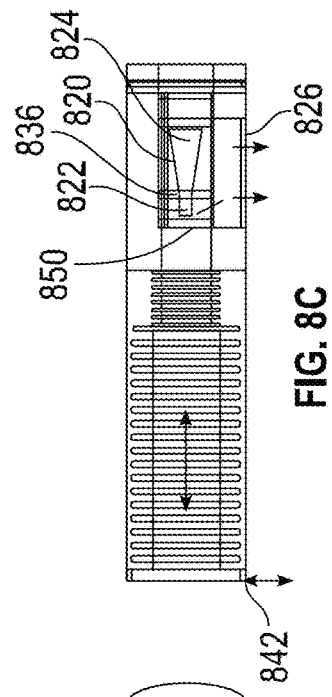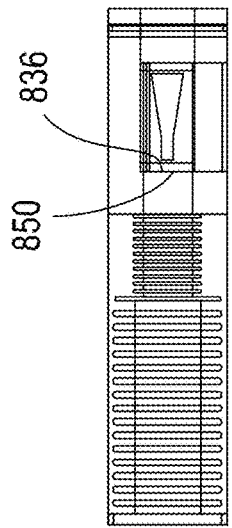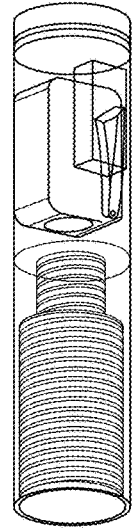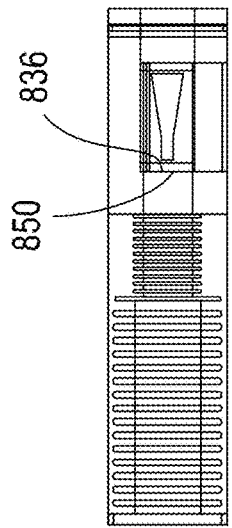

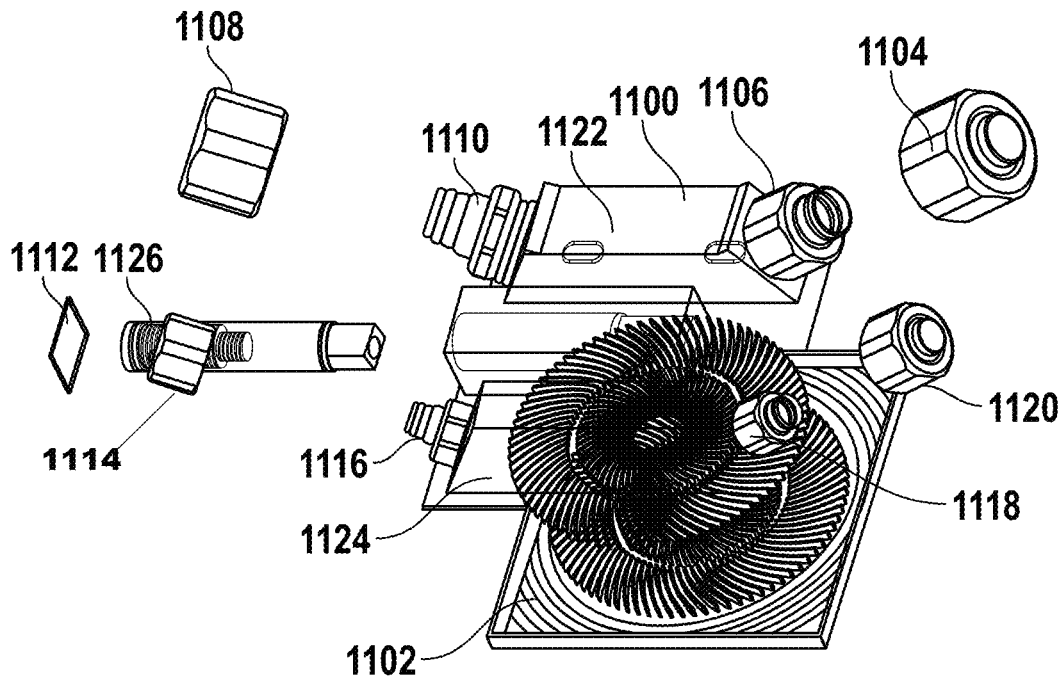
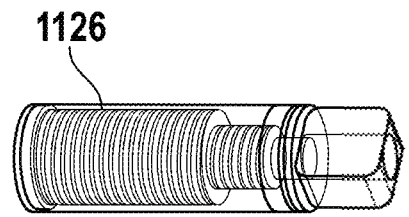
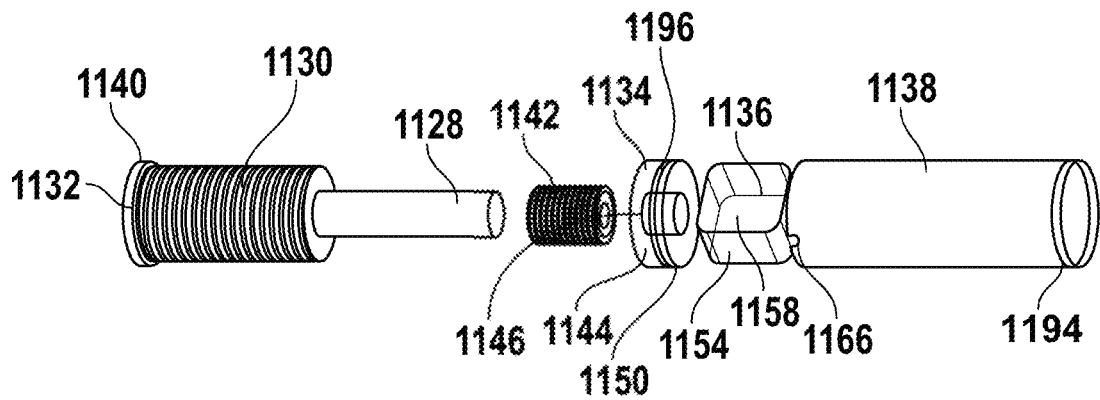
FIG. 11B

MICROCHANNEL HEAT SINK DEVICE

CROSS-REFERENCE TO RELATED APPLICATIONS

The present continuation-in-part patent application claims priority benefit under 35 U.S.C. 120 of the U.S. nonprovisional patent application Ser. No. 17/360,003, "A Reverse-Return Parallel Loop Thermal Management System for an Electronic Device", filed on 28 Jun. 2021, under 35 U.S.C. 119 (e). The contents of this/these related patent application(s) is/are incorporated herein by reference for all purposes to the extent that such subject matter is not inconsistent herewith or limiting hereof.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to a heat sink. More particularly, certain embodiments of the invention relate to a microchannel heat sink for efficient electronic device cooling.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

The use of heat sinks for electronics devices may be used for efficient cooling of heat source components, such as, without limitation CPUs, GPUs, etc. Efficient cooling of such components may vastly improve performance while improving system longevity. Especially in larger scale operations, such as, without limitation, server farms, supercomputers, etc., efficient cooling solutions may reduce operation costs as well.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art generally useful to be aware of is that conventional heat sink devices may use air or liquid to cool a heat-generating device and ensure that the running temperature of the device may be under the limits of MTBF deterioration. Conventional cooling devices, while adequate, may be vastly improved in cooling especially electronics devices, and such improvements may be critical in enhancing performance and longevity of a system while reducing costs.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A-2C illustrate an exemplary heat sink, wherein FIG. 2A shows an exploded view of a heat sink, FIG. 2B shows a prospective view of a heat sink, and FIG. 2C shows a side view of a heat sink, in accordance with an embodiment of the present invention;

FIGS. 3A-3C illustrate an exemplary heat sink, wherein FIG. 3A shows an exploded view of a heat sink, FIG. 3B shows a plain view of a heat sink, and FIG. 3C shows a side view of a heat sink, in accordance with an embodiment of the present invention;

FIGS. 4A-4B illustrate an exemplary microchannel heat sink, wherein FIG. 4A shows an exploded view of a microchannel heat sink, and FIG. 4B shows a cross-sectional view of a microchannel heat sink, in accordance with an embodiment of the present invention;

FIGS. 5A-5C illustrate a flow pattern of an exemplary heat exchanger, wherein FIG. 5A shows a perspective view of a flow pattern of a heat exchanger, FIG. 5B shows a flow pattern of a first layer of a heat exchanger, and FIG. 5C shows a flow pattern of a second layer of a heat exchanger, in accordance with an embodiment of the present invention;

FIGS. 6A-6C illustrate an exemplary sensing chamber, wherein FIG. 6A shows a prospective view of a sensing chamber, FIG. 6B shows a prospective, cross-section of a sensing chamber, and FIG. 6C shows a cross-section of a sensing chamber, in accordance with an embodiment of the present invention;

FIGS. 8A-8E illustrate an exemplary thermal regulation valve (TRV), wherein FIG. 8A shows an exploded view of a thermal regulation valve, FIG. 8B shows a first operation position of a thermal regulation valve, FIG. 8C shows a second operation position of a thermal regulation valve, FIG. 8D shows a third operation position of a thermal regulation valve, and FIG. 8E shows a fourth operation position of a thermal regulation valve, in accordance with an embodiment of the present invention;

FIGS. 10A-10D illustrate an exemplary microchannel heat sink with an incorporated diaphragm, wherein FIG. 10A shows an exploded view of a microchannel heat sink, FIG. 10B shows a side view of a microchannel heat sink, FIG. 10C shows a cross-sectional view of a microchannel heat sink, and FIG. 10D shows a thermal regulation valve, in accordance with an embodiment of the present invention; and FIGS. 11A-11D illustrate an exemplary heat sink with an external sliding block, wherein FIG. 11A shows an exploded view of a heat sink with an external sliding block, FIG. 11B shows an exploded view of a thermal regulation valve, FIG. 11C shows a prospective view of a cover, and FIG. 11D shows a side view of a cover, in accordance with an embodiment of the present invention.

Figure 1:
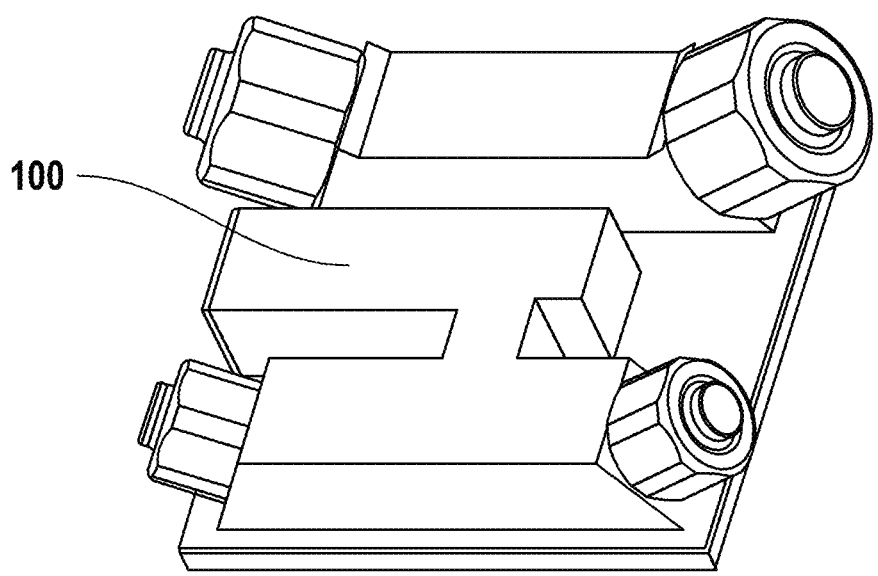
FIG. 1 illustrates an exemplary heat sink, in accordance with an aspect of the present invention.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See *Energy Absorption Sys., Inc.* v. *Roadway Safety Servs., Inc.*, Civ. App. 96-1264, slip op. at 10 (Fed. Cir. Jul. 3, 1997) (unpublished) *Hybridtech* v. *Monoclonal Antibodies, Inc.*, 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See *Seattle Box Co.* v. *Industrial Crating & Packing, Inc.*, 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re *Frye*, Appeal No. 2009-006013, 94 USPQ2d 1072, 1077, 2010 WL 889747 (B.P.A.I. 2010) Depending on its usage, the word "substantially" can denote either language of approximation or language of magnitude. *Deering Precision Instruments, L.L.C.* v. *Vector Distribution Sys., Inc.*, 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognized in case law to have the dual ordinary meaning of connoting a term of approximation or a term of magnitude. See *Dana Corp.* v. *American Axle & Manufacturing, Inc.*, Civ. App. 04-1116, 2004 U.S. App. LEXIS 18265, *13-14 (Fed. Cir. Aug. 27, 2004) (unpublished). The term "substantially" is commonly used by claim drafters to indicate approximation. See *Cordis Corp.* v. *Medtronic AVE Inc.*, 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also *Deering Precision Instruments, LLC* v. *Vector Distribution Sys., Inc.*, 347 F.3d 1314, 1322 (Fed. Cir. 2003); *Epcon Gas Sys., Inc.* v. *Bauer Compressors, Inc.*, 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, *Liquid Dynamics Corp.* v. *Vaughan Co.*, 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In *Cordis Corp.* v. *Medtronic AVE, Inc.*, 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In *Anchor Wall Systems* v. *Rockwood Retaining Walls, Inc.*, 340 F.3d 1298, 1311 (Fed. Cir. 2003)" Id. at 1311. Similarly, the plain language of Claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see *Deering Precision Instruments, L.L.C.* v. *Vector Distrib. Sys., Inc.*, 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., *Epcon Gas Sys., Inc.* v. *Bauer Compressors, Inc.*, 279 F.3d 1022 (Fed. Cir. 2002) (construing the terms "substantially constant" and "substantially below"); *Zodiac Pool Care, Inc.* v. *Hoffinger Indus., Inc.*, 206 F.3d 1408 (Fed. Cir. 2000) (construing the term "substantially inward"); *York Prods., Inc.* v. *Cent. Tractor Farm & Family Ctr.*, 99 F.3d 1568 (Fed. Cir. 1996) (construing the term "substantially the entire height thereof"); *Tex. Instruments Inc.* v. *Cypress Semiconductor Corp.*, 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see *AK Steel Corp.* v. *Sollac*, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by *Pall Corp.* v. *Micron Separations, Inc.*, 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see *Verve LLC* v. *Crane Cams Inc.*, 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In *Andrew Corp.* v. *Gabriel Elecs. Inc.*, 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in *Ecolab Inc.* v. *Envirochem, Inc.*, 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see *Ecolab Inc.* v. *Envirochem Inc.*, 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see *Pall Corp.* v. *Micron Seps.*, 66 F.3d 1211, 1217, 36 USPQ2d 1225, 1229 (Fed. Cir. 1995); see, e.g., *Andrew Corp.* v. *Gabriel Elecs. Inc.*, 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte *Mallory*, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said, "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred, or induced by any pattern(s) of description, embodiments, examples, or referenced prior-art that may (or may not) be provided in the present patent.

References to "end user", or any similar term, as used herein, is generally intended to mean late-stage user(s) as opposed to early-stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, users, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising" And "contain" and variations of the—Such terms are open-ended and mean "including but not limited to". When employed in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. . . . sctn. 112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

All terms of exemplary language (e.g., including, without limitation, "such as", "like", "for example", "for instance", "similar to", etc.) are not exclusive of any other, potentially, unrelated, types of examples; thus, implicitly mean "by way of example, and not limitation . . . ", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see *Norian Corp.* v *Stryker Corp.*, 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus, in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s).

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

FIG. 1 illustrates an exemplary heat sink device, in accordance with an aspect of the present invention. Heat sinks 100 may be used to recover heat from, for example, without limitation, datacenter, or electronic devices. Heat sinks 100 may have advantages over conventional heat sinks, as will be described below.

FIGS. 2A-2C illustrate an exemplary heat sink device, wherein FIG. 2A shows an exploded view of a heat sink, FIG. 2B shows a prospective view of a heat sink, and FIG. 2C shows a side view of a heat sink, in accordance with an embodiment of the present invention. Heat sink 200 may include three major subassemblies: thermal regulation valve-bulb (TRV) 202, cover 214, and subassembly of microchannel heat sink layers 236. TRV 202 may include sensing bulb 204, capillary tube 206, bellow 208, valve head 210, and installation plate 212, and may be installed in installation hole 254. The internal volume of sensing bulb 204, capillary tube 206, and bellow 208 may be charged with working fluid such as, without limitation, refrigerants, gasses, etc. Sensing bulb 204 The working fluid in the sensing bulb will expand or contract with the variation of temperature. Since the bulb was attached on the surface of heat sources tightly, the temperature variation of heat source will be sensed by the working fluid in the bulb and then create volume variation of working fluid. The rate of volumetric change depends on the thermodynamic characteristics of working fluid, which can be selected for a certain application may be placed in cutting 238 and pressed tightly by cover 214 on a heat source to achieve adequate contact. Cut-through 213 on the edge of cover 214 may allow capillary tube 206 to go through. So, the capillary tube 206 may be within the footprint limits of heat sink 200. The location of cut-through 213 is at the corresponding side of cutting 238.

Cut-through 213 may be one or symmetrical two. Temperature variations of heat sources may be detected by sensing bulb 204 and transferred to a pressure variation driving the deflection of bellow 208. Deflection of bellow 208 is a compression or extension of bellow 208 along an axial centerline referred to as 'deflection, axial'. With the deflection of bellow 208, valve head 210 may be moved downward and upward. As a result, the gap between valve head 210 and valve seat 232 may be adjusted with a variation in temperature. When an internal pressure in the temperature sensing chamber formed by bellow 208, sensing bulb 204 and capillary tube 206 is increased, bellow 208 may expand to push valve head 210 forward. When the internal pressure in the temperature sensing chamber formed by bellow 208, sensing bulb 204 and capillary tube 206 is decreased, bellow 208 may shrink and pull the valve head 210 backward. Because the sensing component is sensing bulb 204, structures about the internal sensing chambers may not be required. Layers of curved, segmented, diverged microchannels, such first microchannel 242 and second microchannel 244 may be manufactured on bottom plate 248 directly. Fluid may flow through the adjustable gap between valve head 210 and valve seat 232 to first plenum 246 and second (inlet) plenum 256, and subsequently into microchannels which may be heated by heat sources. Vaporized fluid from the microchannels may be collected in outlet manifold 240 and flow into vapor channels 234 through vapor exit hole 260, while liquid may flow through liquid channels 258. Bottom surface 250 of heat sink 200 may be attached to a heat source.

Heat sink 200 may be connected with a coolant supply hose using first fitting 216 and first adapter 218, and a portion of the coolant may flow to TRV 202 while the remaining coolant may flow out of heat sink 200 through second fitting 220 and second adapter 222. A vapor inlet hose may be connected with heat sink 200 using third fitting 224 and third adapter 226, while a vapor outlet house may be connected with heat sink 200 using fourth fitting 228 and fourth adapter 230.

The aforementioned connection adaptors and fittings may be, for example, without limitation, compression fittings for flexible hoses. However, as will be appreciated by one skilled in the art, the type of connector may depend on factors such as, but not limited to, pressure, size, type of tube, etc. and many different types of connectors may be used such as but not limited to compression fittings, flare fittings, ferrule/sleeve fittings, O-ring type fittings or thread fittings.

FIGS. 3A-3C illustrate an exemplary heat sink device, wherein FIG. 3A shows an exploded view of a heat sink, FIG. 3B shows a plain view of a heat sink, and FIG. 3C shows a side view of a heat sink, in accordance with an embodiment of the present invention. Heat sink 300 may include three subassemblies, which may include, for example, without limitation, microchannel layers 305, cover 310, and thermal regulation valve (TRV) insert 315. Microchannel layers 305 may be formed at one time using techniques such as, but not limited to, 3D printing, or formed separately and subsequently brazed together. Additive manufacturing (AM) like 3D printing may form the microchannels under certain restrictions of minimal thickness of fins or minimal gap of channels. Subtractive manufacturing (SM) like CNC machining removes material to create parts. With additive manufacturing (AM), complex chamber and curves could be made, but with subtractive manufacturing (SM) special machining tools are required to get the complex curves. Thermal regulation valve (TRV) insert may be built separately and placed into thermal regulation valve chamber 320. Blind plate 325 may be brazed or bolted to the wall of thermal regulation valve chamber 320.

Heat sink 300 may be connected to coolant supply hose using first adaptor 330 and first fitting 335, and a portion of the coolant may flow to thermal regulation valve (TRV) insert 315 while the remaining coolant may flow out of heat sink 300 through second adaptor 340 and second fitting 345. A vapor inlet hose may be connected to heat sink 300 via third adaptor 350 and third fitting 355, and a vapor outlet hose may be connected to heat sink 300 via fourth adaptor 360 and fourth fitting 365. Coolant may flow through liquid channel 375, while vapor may flow through vapor channel 370. Coolant may flow through first fitting 335 into liquid channel 375, and then part of the coolant will flow through liquid inlet branch 380 into the thermal regulation valve insert 315. The rest of coolant will flow out of vapor channel 370 through second fitting 345. Liquid channel 375 may be connected with liquid inlet branch 380 internally.

The aforementioned connection adaptors and fittings may be, for example, without limitation, compression fittings for flexible hoses. However, as will be appreciated by one skilled in the art, the type of connector may depend on factors such as, but not limited to, pressure, size, type of tube, etc. and many different types of connectors may be used. The connectors may include but not limited to compression fittings as described, flare fittings, ferrule/sleeve fittings, O-ring type fittings, or thread fittings.

Figure 4A:
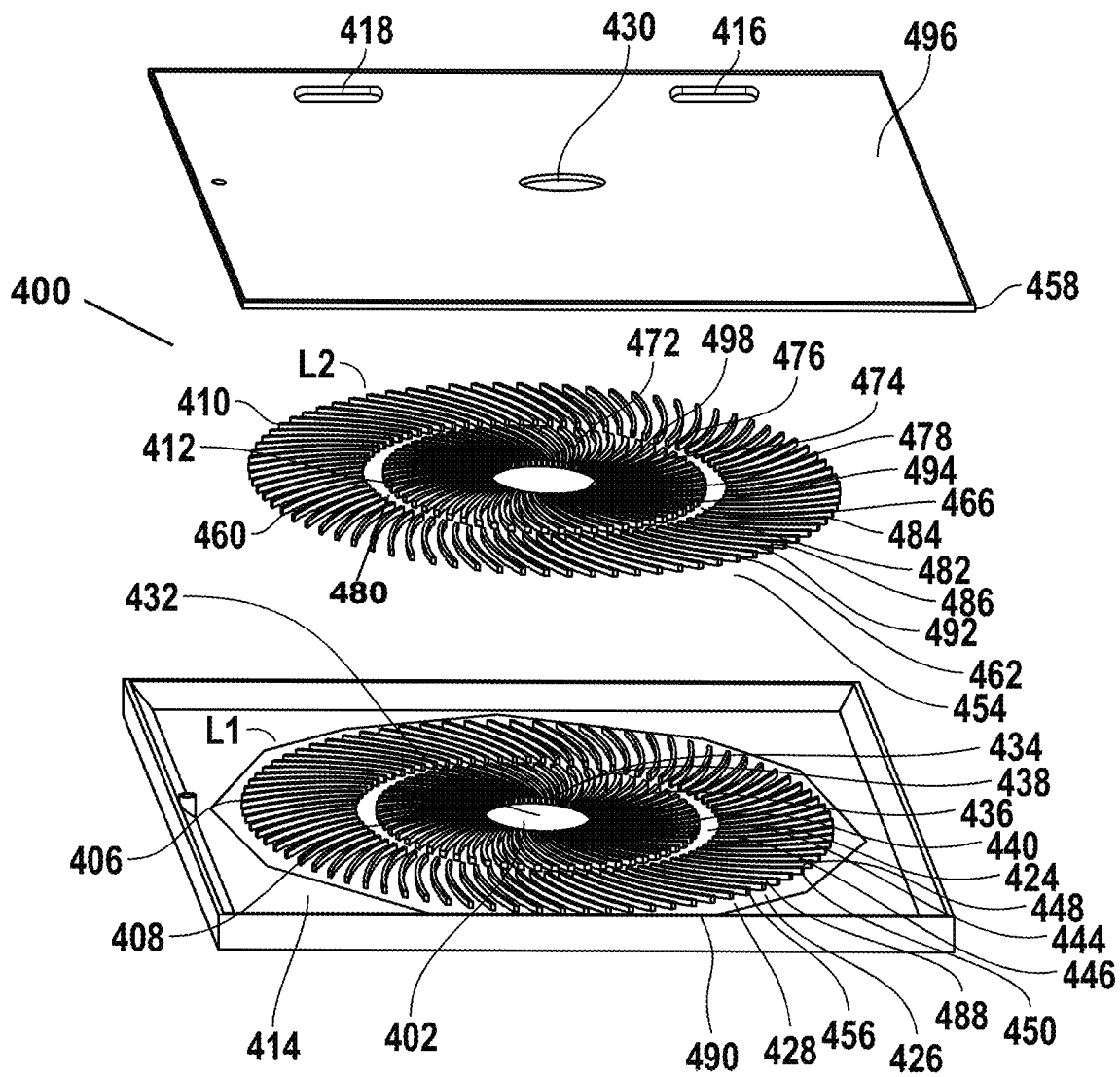
Figure 4B:
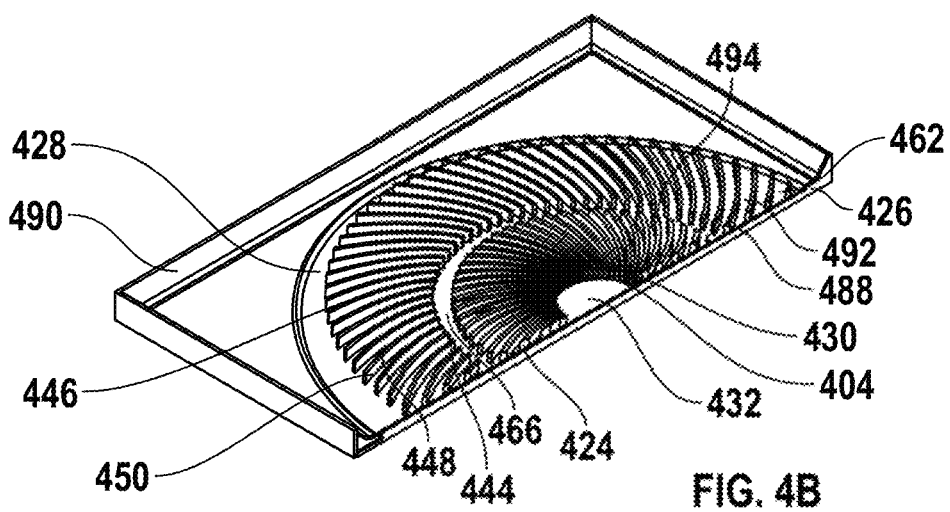

FIGS. 4A-4B illustrate an exemplary microchannel heat sink, wherein FIG. 4A shows an exploded view of a microchannel heat sink, and FIG. 4B shows a cross-sectional view of a microchannel heat sink, in accordance with an embodiment of the present invention. In one embodiment, microchannel heat sink 400 may comprise two microchannel layers L1 and L2 (also referred to as L1 and L2). And microchannel layers L1 and L2 may each comprise two segments, namely circle A and circle B segments (also referred to as circle A and circle B). Microchannel heat sink 400 may include a central inlet plenum formed from L1 central flow channel 402 and L2 central flow channel 404, layers including radial microchannels (the radial microchannels include the channels formed by L1 circle B fins 408, L1 circle A fins 406, L2 circle A fins 410 and L2 circle B fins 412), and a circumferential outlet chamber (the chamber formed by 428 and 414). The central inlet plenum may include an impingement region (Impingement happens on the impinging surface 432 of L1 central flow channel 402. L1 central flow channel 402 and L2 central flow channel 404 may form the inlet plenum, in which the whole impingement processes including liquid flow to the impinging surface 432, impinging on the surface 432 and spread outwards after impingement.) and may connect with the microchannel layers that include microchannels radially extending from the impingement region. Coolant fluid may impinge the bottom of the inlet plenum and subsequently flow through the radially extending microchannels toward the perimeter of each layer. The second layer L2 may be arranged in a staggered angle to the first layer L1 (L1 may refer to the first or bottom circular fin layer, L2 may refer to the second or top circular fin layer). A fluid outlet of the first layer (which is L1 circle A radial flow channels outlet 448) may be joined with the fluid outlet of second layer (which is L2 circle A radial flow channels outlet 484). In other embodiment, microchannel heat sink 400 may comprise more than two microchannel layers. For example, microchannel heat sink 400 may comprise microchannel layers L1, L2, L3, etc. Additional microchannel layers may be included depending on the heat load. Further, microchannel layers L1 and L2 may each comprise more than two segments. For example, microchannel layers L1 and L2 may each comprise circle A, circle B, circle C, etc. Microchannel heat sink 400 may be incorporated into a power electronics module having a power electronics device. The microchannels may be circumferentially distributed, and the profiles of the microchannels in each layer may be curved. The cross-sectional area of the microchannels may diverge radially, and each microchannel may be segmented. The discontinue part of each microchannel may form an intermediate ring. The basis geometrical features have been labeled in the drawing. Other geometrical features may be formed and described by the formation of basic features.

Microchannel heat sink 400 may comprise liquid inlet 430, L1 central flow channel 402, L2 central flow channel 404, L1 circle A fins 406, L1 circle B fins 408, L2 circle A fins 410, L2 circle B fins 412, flow channel 414, first vapor outlet 416, and second vapor outlet 418. L1 may refer to the first or bottom circular fin layer, L2 may refer to the second or top circular fin layer, circle A may refer to the outer ring segment, and circle B may refer to the inner ring segment. As will be described in greater detail below, the coolant fluid may be introduced into microchannel heat sink 400 to reduce the operating temperature of a power electronics device. Liquid inlet 430 may be in a variety of different configurations, and is not limited to the configuration shown in FIG. 4A. For example, without limitation, liquid inlet 430 may be configured as an orifice, slot, matrix of orifices and/or slots, bel mouth, nozzle, sprayer, etc. to form different types of flow patterns. The configuration of liquid inlet 430 may be integrated with a type of adjustable valve mechanism driven by actuators, by which flow through liquid inlet 430 may be controlled. Liquid inlet 430 may be a separate component from the second layer of microchannel heat sink 400 and may be a mountable component for ease of machining if in, for example, without limitation, a bell mouth configuration. Liquid inlet 430 may be composed of thermally conductive material including, but not limited to, aluminum and copper to aid in transfer of thermal energy. Coolant fluid may be introduced into liquid inlet 430. A coolant fluid line may be fluidly coupled to liquid inlet 430 via fluid couplings to provide coolant fluid to the inlet jet. The coolant fluid line may be connected to a coolant fluid source with fluid pumps. The coolant fluid may be any type of fluid used for heat exchanging applications, such as, but not limited to, refrigerant, water, etc.

The first microchannel or circular fin layer L1 may comprise L1 central flow channel 402, L1 circle A fins 406, L1 circle B fins 408, L1 ring segment 424, L1 base plate 426, L1 circle A flow channel 428, and flow channel 414. A plurality of radially extending microchannels may be formed between the fins. Coolant fluid flow from L1 central flow channel 402 may impinge onto the surface 432 of L1 central flow channel 402, by which the advantages of impingement may be used to carry heat away. Compared to other heat or mass transfer arrangements, impingement may offer efficient use of the fluid and high transfer rates. For example, compared with conventional convection cooling by confined flow parallel to the cooled surface, impingement may produce heat transfer coefficients that are up to threefold higher at a given maximum flow speed, because the impingement boundary layers are much thinner, and often the spent flow after the impingement may serve to further turbulate or agitate the surrounding fluid. Subcooled liquid may be recommended for two-phase fluid to impinge. Because of the large volume of L1 central flow channel 402, fluid may be distributed evenly into L1 circle B radial flow channels inlet 434 formed from L1 circle B inlet side radial fins 436 of two adjacent fins of L1 circle B fins 408. L1 circle B radial flow channels inlet 434 may be evenly located circumferentially around L1 central flow channel 402. L1 central flow channel 402 and L2 central flow channel 404 may form the inlet plenum, in which liquid impingement and distribution may occur. After impinging surface 432 of L1 central flow channel 402, coolant fluid may flow outwardly through L1 circle B radial flow channels inlet 434 towards L1 circle B radial flow channels outlet 438. L1 circle B radial flow channels outlet 438 may be formed from L1 circle B radial fins outlet side 440 of L1 circle B fins 408. L1 circle B fins 408 may be curved, and the cross-sectional area of L1 circle B radial flow channels inlet 434 may be smaller than that of L1 circle B radial flow channels outlet 438, which may be diverged microchannels. The diverging channels may match the column expansion caused by the emergence of bubbling of the evaporation process and result in more stable flow with a smaller pressure drop. L1 circle B fins 408 may have curved walls geometrically optimized to reduce pressure drop, enhance heat transfer, and direct coolant fluid toward the perimeter of L1 circle B 442. The term optimized as used herein may mean that the geometrical configuration of the features and resulting microchannels may be designed to enhance fluid flow, reduce pressure drop, and increase heat transfer to the coolant fluid. As such, the microchannels may not simply be channels formed by a circle, but also may be formed by involutes or splines, and the features defining the microchannels may include curved walls, a diverging cross-section, and may vary in size and shape. By selecting the geometrical configuration of L1 circle B fins 408, coolant fluid may more efficiently flow within the microchannels.

L1 circle B fins 408 and L1 circle A fins 406 may be intermittent, and the annular volume may be L1 ring segment 424. Coolant fluid from L1 circle B radial flow channels outlet 438 may flow into L1 ring segment 424, in which good mixture, rebalancing, and expansion may occur. As a result, a more stable and efficient two-phase heat transfer may be achieved.

Coolant fluid from L1 ring segment 424 may flow into L1 circle A radial flow channels inlet 444 formed from L1 circle A radial fins inlet side 446 of L1 circle A fins 406. L1 circle A radial flow channels inlet 444 may be evenly located circumferentially around L1 ring segment 424. Coolant fluid may flow outwardly though L1 circle A radial flow channels inlet 444 toward L1 circle A radial flow channels outlet 448. L1 circle A radial flow channels outlet 448 may be formed from L1 circle A radial fins outlet side 450 of L1 circle A fins 406. L1 circle A fins 406 may be curved, and the cross-sectional area of L1 circle A radial flow channels inlet 444 may be smaller than that of L1 circle A radial flow channels outlet 448, which may be diverged microchannels. These diverging channels may match the volume expansion caused by the emergence of bubbling in the evaporation process and result in a more stable flow and smaller pressure drop. L1 circle A fins 406 may be geometrically optimized to reduce pressure drop, enhance heat transfer, and direct coolant fluid toward the perimeter of L1 circle A 452. By selecting the geometrical configuration (i.e., size and position) of L1 circle A fins 406, the coolant fluid may more efficiently flow within the microchannels.

L2 bottom surface 454 may be brazed or machined as a single part with L1 fins top surface 456. L1 base plate 426, the walls of L1 circle B fins 408 and L1 circle A fins 406, and L2 bottom surface 454 may form the microchannel flow paths of the first layer. Cover bottom surface 458 may be brazed or machined as a single part with the L2 fins top surface 460. L2 base plate 462, the walls of L2 circle B fins 412 and L2 circle A fins 410, and L2 bottom surface 454 may form the microchannel flow paths of second layer L2.

Second microchannel or circular fin layer L2 may comprise L2 central flow channel 404, L2 circle A fins 410, L2 circle B fins 412, L2 ring segment 466, and L2 base plate 462. L2 circle A 468 may refer to the outer ring of fins in second layer L2, while L2 circle B 470 may refer to the inner ring of fins in second layer L2. A plurality of radially extending microchannels may be formed between the fins. Coolant fluid may flow from L2 central flow channel 404 and may be distributed evenly into L2 circle B radial flow channels inlet 472 formed from L2 circle B radial fins inlet side 474 of L2 circle B fins 412 due to the large volume of L2 central flow channel 404. L2 circle B radial flow channels inlet 472 may be evenly located/disposed circumferentially around L2 central flow channel 404. Coolant fluid may flow outwardly through L2 circle B radial flow channels inlet 472 toward L2 circle B radial flow channels outlet 476. L2 circle B radial flow channels outlet 476 may be formed from L2 circle B radial fins outlet side 478 of L2 circle B fins 412. L2 circle B fins 412 may be curved, and the cross-sectional area of L2 circle B radial flow channels inlet 472 may be smaller than that of L2 circle B radial flow channels outlet 476, which may be diverged microchannels. These diverging channels may match volume expansion caused by the emergence of bubbling in the evaporation process and result in a stable flow and smaller pressure drop. L2 circle B fins 412 may have curved walls and may be geometrically optimized to reduce pressure drop, enhance heat transfer, and direct coolant fluid toward the perimeter of L2 circle B 470. By selecting a geometrical configuration (i.e., size and position) for L2 circle B fins 412, coolant fluid may more efficiently flow within the microchannels.

L2 circle B fins 412 and L2 circle A fins 410 may be intermittent, and the annular volume may be called L2 ring segment 466. Coolant fluid from L2 circle B radial flow channels outlet 472 may flow into L2 ring segment 466, in which good mixture, rebalancing, and expansion may occur. As a result, a much more stable and efficient two-phase heat transfer may be achieved.

Coolant fluid from L2 ring segment 466 may flow into L2 circle A radial flow channels inlet 480 formed from L2 circle A radial fins inlet side 482 of L2 circle A fins 410. L2 circle A radial flow channels inlet 480 may be evenly located circumferentially around L2 ring segment 466. Coolant fluid may flow outwardly though L2 circle A radial flow channels inlet 480 toward L2 circle A radial flow channels outlet 484. L2 circle A radial flow channels outlet 484 may be formed by L2 circle A radial fins outlet side 486 of L2 circle A fins 410. L2 circle A fins 410 may be curved, and the cross-sectional area of L2 circle A radial flow channels inlet 480 may be smaller than that of L2 circle A radial flow channels outlet 484, which may be diverged microchannels. These diverging channels may match volume expansion caused by the emergence of bubbling in the evaporation process and result in a much more stable flow with a smaller pressure drop. L2 circle A fins 410 may have curved walls and may be geometrically optimized to reduce pressure drop, enhance heat transfer, and direct coolant fluid toward the perimeter of L2 circle A 468. By selecting a geometrical configuration (i.e., size and position) for L2 circle A fins 410, coolant fluid may more efficiently flow within the microchannels. Yes, the quantity of layers depends on the capacity requirements and size limitation. But more than three layers are not recommended, regarding the diminishing marginal benefits of capacity against costs.

Figure 5A:
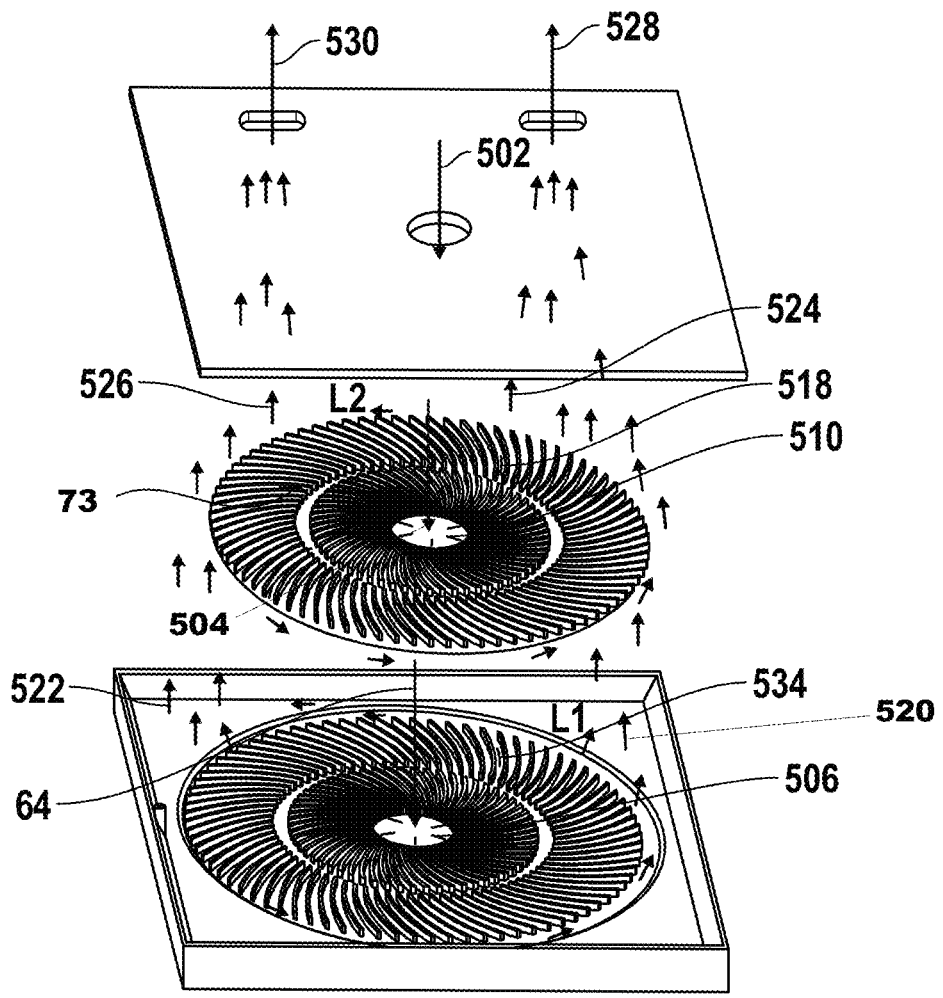
Figure 5B:
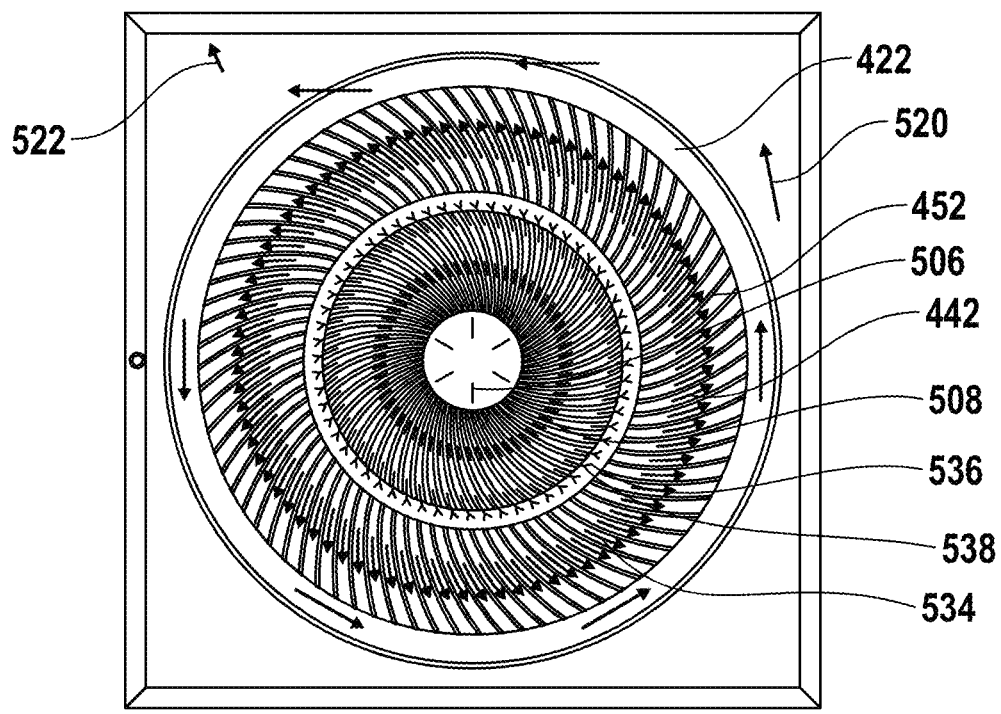
Figure 5C:
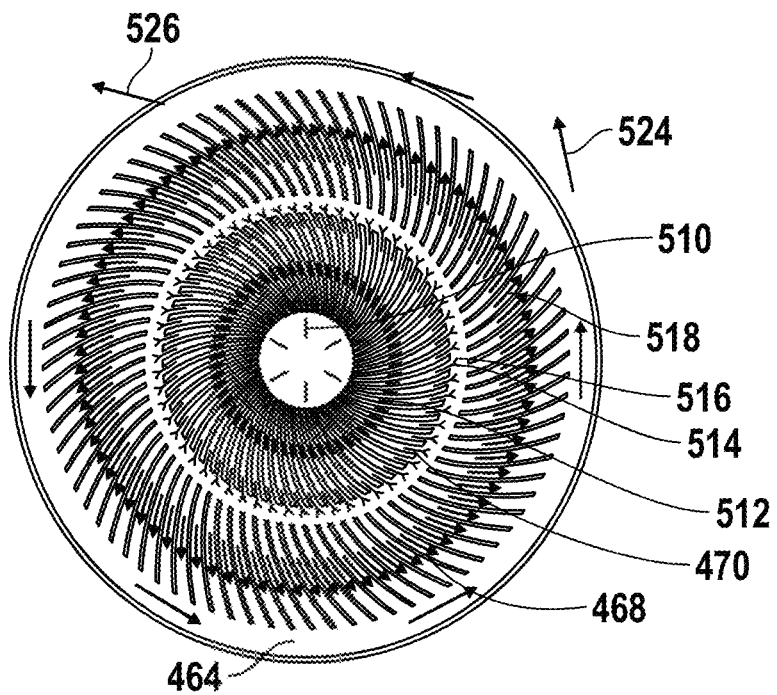

FIGS. 5A-5C illustrate a flow pattern of an exemplary heat exchanger, wherein FIG. 5A shows a perspective view of a flow pattern of a heat exchanger, FIG. 5B shows a flow pattern of a first layer L1 of a heat exchanger, and FIG. 5C shows a flow pattern of a second layer L2 of a heat exchanger, in accordance with an embodiment of the present invention. With reference to FIGS. 4A-4B and FIGS. 5A-5C, fluid 502 may flow into the inlet plenum formed from L1 central flow channel 402 and L2 central flow channel 404 through liquid inlet 430. Inside the inlet plenum, fluid 502 may flow downward in direction 504, and may be divided into first branch 504 to the second layer L2 and 506 to the first layer L1. Due to the large size of the inlet plenum, fluid 502 may flow in outward directions 506 and distributed to L1 circle B radial flow channel inlet 434, and flow along directions 508. Once fluid 502 exits L2 circle B radial flow channel outlet 438, fluid 502 may join together and be mixed in L1 ring segment 424 and be balanced and redistributed into L1 circle A radial flow channel inlet 444 in direction 536 and direction 538. Fluid 502 may flow in L2 circle A radial flow channels 492 in direction 534, which may be diverging and curved channels.

Fluid 502 may flow in direction 65 to be evenly distributed into L2 circle B radial flow channels inlet 472 and flow along the microchannel in direction 512. Once fluid 502 flows out of L2 circle B radial flow channels outlet 476, fluid 502 may be mixed together in L2 ring segment 466 and be balanced and redistributed into L2 circle A radial flow channels inlet 480 in direction 514 and direction 516. Fluid 502 may flow in L2 circle A radial flow channels 492 in direction 518, which may be diverging and curved channels. Fluid 502 from L1 circle A radial flow channels outlet 448 and L2 circle A radial flow channels outlet 484 may join together in flow channel 414 and guided to first vapor outlet 416 and second vapor outlet 418 on cover 496. L1 circle A flow channel 428 may share volume with L1 circle A radial flow channel 448, and thus fluid 502 may collect in the shared volume. L1 circle A flow channel 428 may be a part of the volume of flow channels 414, which may be the chamber located between the top surface of L1 base plate 426 and the bottom surface of cover 496. The volume of flow channels 414 may be large enough to achieve a similar outlet static pressure within each microchannel, including L2 circle A radial flow channels 492 and L1 circle A radial flow channels 428. The flow out of L1 circle A flow channel 434 in directions 520 and 522 may join together with the flow out of L2 circle A flow channel 492 in directions 524 and 526, flow upward through first vapor outlet 416 and second vapor outlet 418 of in directions 528 and 530, respectively.

Curved and diverged channels may increase the surface area in which coolant fluid makes contact with walls, and may increase thermal transfer from L1 base plate 426, L1 circle B fins 408, and L1 circle A fins 406 to the coolant fluid. Similarly, curved, and diverged channels may be applied to the second layer as well. The geometric configuration of L1 circle B fins 408 and resulting L1 circle B flow channel 498 positioned there between may be determined by computer simulation, for example. The geometric configuration utilized for L1 circle B flow channel 498 may depend on parameters such as, without limitation, flow resistance, type of coolant fluid, and the desired maximum operating temperature of the power electronics device. Similarly, flow simulation may be used to determine the geometry and the layout of all microchannels. The formation of L1 circle B fins 408 and L1 circle A fins 406 may use different strategies, however. For example, without limitation, the thickness of L1 circle B fins 408 may be constant while the thickness of L1 circle A fins 406 may be variable. Additionally, the curvature of L1 circle B fins 408 and L1 circle A fins 406 may be different. Further, the curvature of one side of the fins may be different from the opposite side, by which variable cross-section may be achieved. The aforementioned design variations may be applied independently to all fins in the present embodiment. Detailed simulation may be used for unfamiliar design variations. The project lines of L2 circle A fins 410 and L2 circle B fins 412 may not necessarily be aligned with the profiles of L1 circle A fins 406 and L1 circle B fins 408. As such, L2 circle A fins 410 and L2 circle B fins 412 of second layer L2 may be rotated by a certain degree coaxially with the central axis of L1 circle A fins 406 and L1 circle B fins 408. If microchannel heat sink 400 has more than two layers, this may also be applied to the additional layers. The offset angle may provide better thermal performance because the hot area in the lower microchannels may contact the corresponding cold area in the upper microchannels, and may result in an even temperature distribution. First vapor outlet 416 and second vapor outlet 418 may be an example of one vapor outlet design. Many alternative outlet designs may also be used, such as, but not limited to, slots, orifices, oval slits, louvers, etc.

Microchannel heat sink 400, including frame 490, L1 base plate 426, L2 base plate 462, cover 496, first layer 532, and second layer L2 may be made of a thermally conductive material that may allow for the transfer of thermal energy from microchannel heat sink 400 to the coolant fluid. Thermally conductive materials may include, for example, without limitation, copper, aluminum, thermally enhanced composite materials, polymer composite materials, etc. The microchannels and corresponding components may be formed using, for example, without limitation, a molding process, 3D printing, a machining process, etc. to achieve the desired shape and configuration.

Microchannel heat sink 400 may be used to remove heat flux generated by processors and power electronics devices. The process may be, for example, without limitation, CPUs, GPUs, TPUs, etc. The power electronics devices may be, for example, without limitation, IGBTs, RIGBTs. MOFSETs, power MOFSETs, diodes, transistors, and any combination thereof. For example, without limitation, the development of AI technologies may drive high-performance processors to higher integrations and speed, while servers may involve more processors for each unit to achieve an enhanced calculation capability. Additionally, power electronics devices or devices in a vehicular electrical system, such as, but not limited to, hybrid-electric or electric vehicles. Such power electronics devices may generate significant heat flux when propelling a vehicle. As will be understood by one skilled in the art, the microchannel heat exchangers described herein may also be utilized in other applications, and may not be limited to computation and vehicular applications.

Figure 6A:
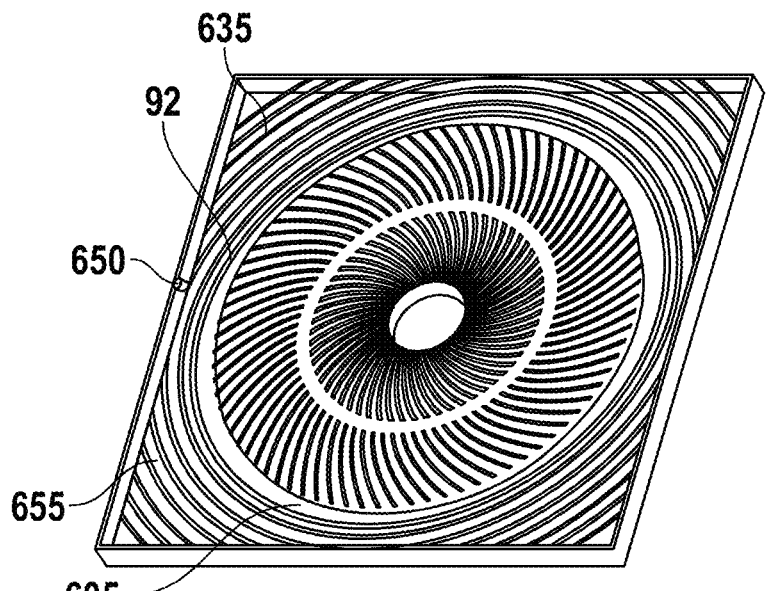
Figure 6B:
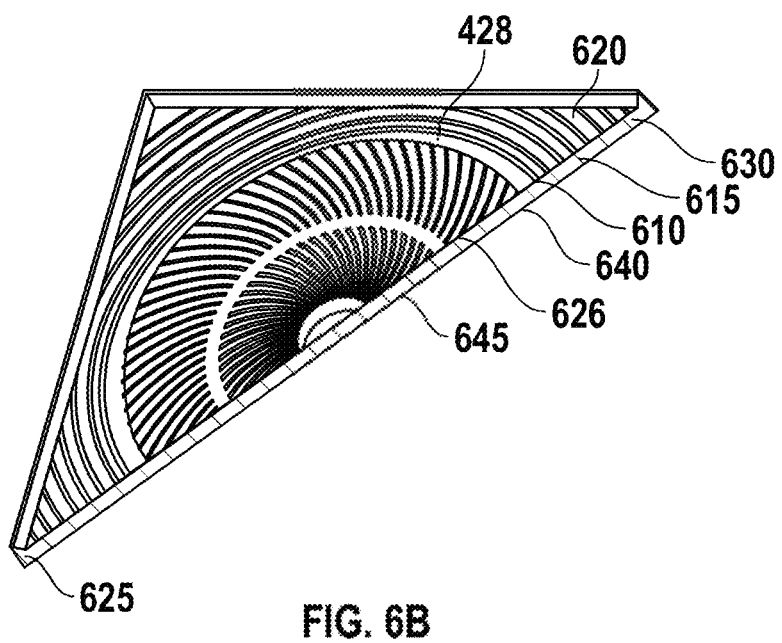
Figure 6C:
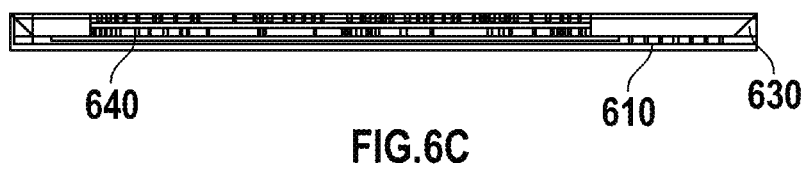

FIGS. 6A-6C illustrate an exemplary sensing chamber, wherein FIG. 6A shows a prospective view of a sensing chamber, FIG. 6B shows a prospective, cross-section of a sensing chamber, and FIG. 6C shows a cross-section of a sensing chamber, in accordance with an embodiment of the present invention. With reference to FIGS. 4A-4B and FIGS. 6A-6C, the bulb (i.e., sensing component) of the thermal regulation valve may be integrated into the heat sink assembly. Plane 605 may be the bottom of L1 circle A flow channel 428 may be lifted to chamber 610. Thus, a chamber may be formed between plane 615, plane 620, and plane 625, which may include chamber 630 and chamber 610. Fins 635 may be between plane 615 and plane 620 and connect plane 615 to plane 620, wherein wall 640 may immerse into plane 620. As such, the heat from plane 645 may transfer to working fluid enclosed in chamber 630 and chamber 610 quicker, which may enable the thermal regulation valve in improving dynamic responses for temperature control. Additionally, the strength of chamber 630 and chamber 610 may be enhanced if high pressure working sensing fluid is used. Chamber 630, chamber 610, and hole 650 may be fluidly connected. The specific volume of sensing fluid in the chambers may vary with the temperature variation of the heat source. The pressure may be generated and applied onto the surface of the bellow to push the position backward and forward. Hole 650 may be connected pneumatically with the bellow or diaphragm chamber. Plane 655 may be the bottom surface of flow channel 414.

Figure 7:
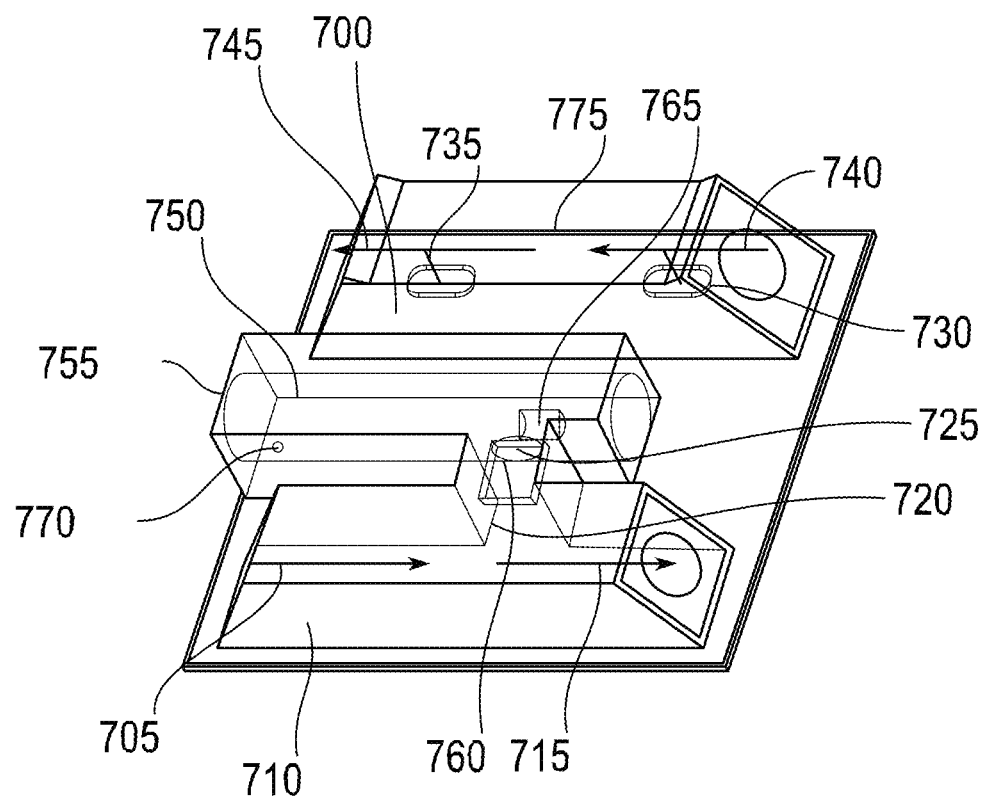
FIG. 7 illustrates an exemplary flow channel, in accordance with an embodiment of the present invention.

FIG. 7 illustrates an exemplary flow channel, in accordance with an embodiment of the present invention. With reference to FIGS. 4A-4B, FIGS. 6A-6C and FIG. 7, cover subassembly 700 may be manufactured separately or printed together with the microchannel layers. Cover 496 may be the base plate of cover subassembly 700. On top of cover 496, there may be liquid channels, vapor channels, and a chamber for the thermal regulation valve (TRV). Such components may be created using, for example, without limitation, 3D printing, conventional machining methods, etc. Liquid in direction 705 within liquid channel 710 may be divided into first stream 715 and second stream 720 Second stream 720 may flow through the port 765, and subsequently into liquid inlet 430 in direction 725. First stream 715 may flow continuously forward, out of the heat sink, and into a downstream heat sink. The flow in direction 725 may be evaporated in a subassembly of microchannel layers and become vapor flowing out of first vapor outlet 416 and second vapor outlet 418 in directions 730 and 735, respectively. The flow in directions 730 and 735 may join with vapor from the heat sink in direction 740 and exit the heat sink in direction 745. Wall 750 of regulation valve chamber 755 may fit with the shell 802 (see FIG. 8A). Channel 760 may be fluidly connected with liquid channel 710 and regulation valve chamber 755, and the cross-section of channel 760 may be rectangular or other similar shapes, as long as no significant pressure drop occurs. Port 765 may be an exit port of channel 760 to regulation valve chamber 755. The geometrical profile of channel 760 may be sufficiently large enough to ensure there is no additional flow restriction through channel 760 Ventilation hole 770 may be connected to hole 650 such that pressure variation in chambers 610 and 630 may be applied onto the bellow.

FIGS. 8A-8E illustrate an exemplary thermal regulation valve (TRV), wherein FIG. 8A shows an exploded view of a thermal regulation valve, FIG. 8B shows a first operation position of a thermal regulation valve, FIG. 8C shows a second operation position of a thermal regulation valve, FIG. 8D shows a third operation position of a thermal regulation valve, and FIG. 8E shows a fourth operation position of a thermal regulation valve, in accordance with an embodiment of the present invention. Thermal regulation valve (TRV) 800 may include five major parts: shell 802, sliding block 804, valve block 806, spring 808, and bellow subassembly 810. The major parts may be installed along the axis of shell 802. Bellow 812 of bellow subassembly 810 may be selected from a variety of currently available models, and may have a maximum axial deflection of 4-5 mm, and have as small a diameter as possible (preferably less than 0.5") depending on the height limitation of the heat sink. Bellow 812 may work under a certain internal pressure depending on the gas to be charged for a certain number of cycles. The working pressure inside bellow 812 may depend on the charging working fluid inside the bellow in reference to the working fluid in the microchannel. The pressure differential applied on the sliding block 804 may come from the pressure differential between charging pressure inside bellow 812 and coolant in microchannels. The pressure inside bellow 812 is a dynamic parameter, and may also be a coupling parameter. More bellows 812 may be selected depending on but not a limitation, the valve sizes, work fluids and so on. The concept/theory of bellow selection may be similar to the bellow applied in thermal expansion valves. One end of bellow subassembly 810 may be sealed by bellow end plate 816, on which ventilation hole 818 may be reserved. The opposite end of bellow subassembly 810 may be brazed with rod 812. Rod 812 may be used to adjust the superheat above the initial charging. Valve block 806 may be solidly mounted to shell 802, and internal cylinder surface 844 of shell 802 may be closely clamped with cylinder surface 852 of valve block 806.

The force from spring 804 against back surface 846 may be applied to bellow 814, which may impact the superheat of TRV 800. Rod 812 may go through central hole 838 and may be connected with sliding block 804. The initial position of sliding block 804 may be a position wherein sliding block outflow-side surface 836 is attached to valve block outflow-side surface 850. Sliding block 804 may be pushed by rod 812 in an axial direction inside chamber 854. Valve block inflow-side surface 840 may make contact with sliding block inflow-side surface 834 and may slide along sliding block inflow side surface 834. In an initial position (i.e., sliding block outflow-side surface 836 is contacting valve block outflow-side surface 850), sliding block inflow-side surface 834 may fully block inflow port 848. Because of the seal between sliding block inflow-side surface 834 and valve block inflow-side surface 840, no liquid may flow through inflow port 848 and into valve block inflow-side surface 840. When bellow 814 is expanded, rod 812 may push sliding block 804 forward. As a result, valve block outflow-side surface 850 may be detached from sliding block outflow-side surface 836, and a gap may form between the two surfaces. The gap may be connected with outflow slot 844. Simultaneously, because of the sliding movement of sliding block inflow-side surface 834 from the initial position to a new position, part of inflow port 848 may be connected to the gap between valve block outflow-side surface 850 and sliding block outflow-side surface 836, while the remaining portion of inflow port 848 may be blocked by sliding block inflow-side surface 834. The axial movement of sliding block 804 may determine the opening of inflow port 848. The profile of inflow port 848, in this case, may be based on hyperbolic curves, by which different flow areas may be achieved per unit axial displacement. Additionally, different profiles may be adopted to achieve a desired flow coefficient.

Inflow port 848 of valve block 806 may be similar to inflow port 820 of shell 802, and after assembly, inflow port 848 and inflow port 820 may coincide. Similarly, valve block inflow-side surface 840 may correspond to outflow port 826 of shell 802, and may coincide after assembly. When TRV 800 is partially open, inflow area 822 and sealing area 824 may be blocked. Notch 828 of shell 802 may correspond to a ventilation hole of the cover assembly, which may allow pressure from internal sensing chambers 810. The sensing chamber will be charged by the certain working fluid. When the working fluid inside the chamber was heated or cooled by the heat sources, the volume of working fluid will be changed accordingly. Since the sensing chamber is internally connected with the internal volume of bellow, the variation of volume will drive the length variation of bellow. Then the valve could response to the temperature variation automatically.

The rate of volumetric change depends on the thermodynamic characteristics of working fluid, which can be selected for a certain application to be transferred to below 814 through ventilation hole 818. The volume between end plate 816 and the blind plate may be designed to be as small as possible to improve the sensitivity of TRV 800. Shell 802 may be composed of, for example, without limitation, copper, or steel. Additionally, sliding block 804 and valve block 806 may be composed of, for example, without limitation, plastic material such as PTFE and nylon for a low friction factor. TRV 800 may be manufactured and assembled separately from the other parts of the heat sink and subsequently installed.

Figure 9:
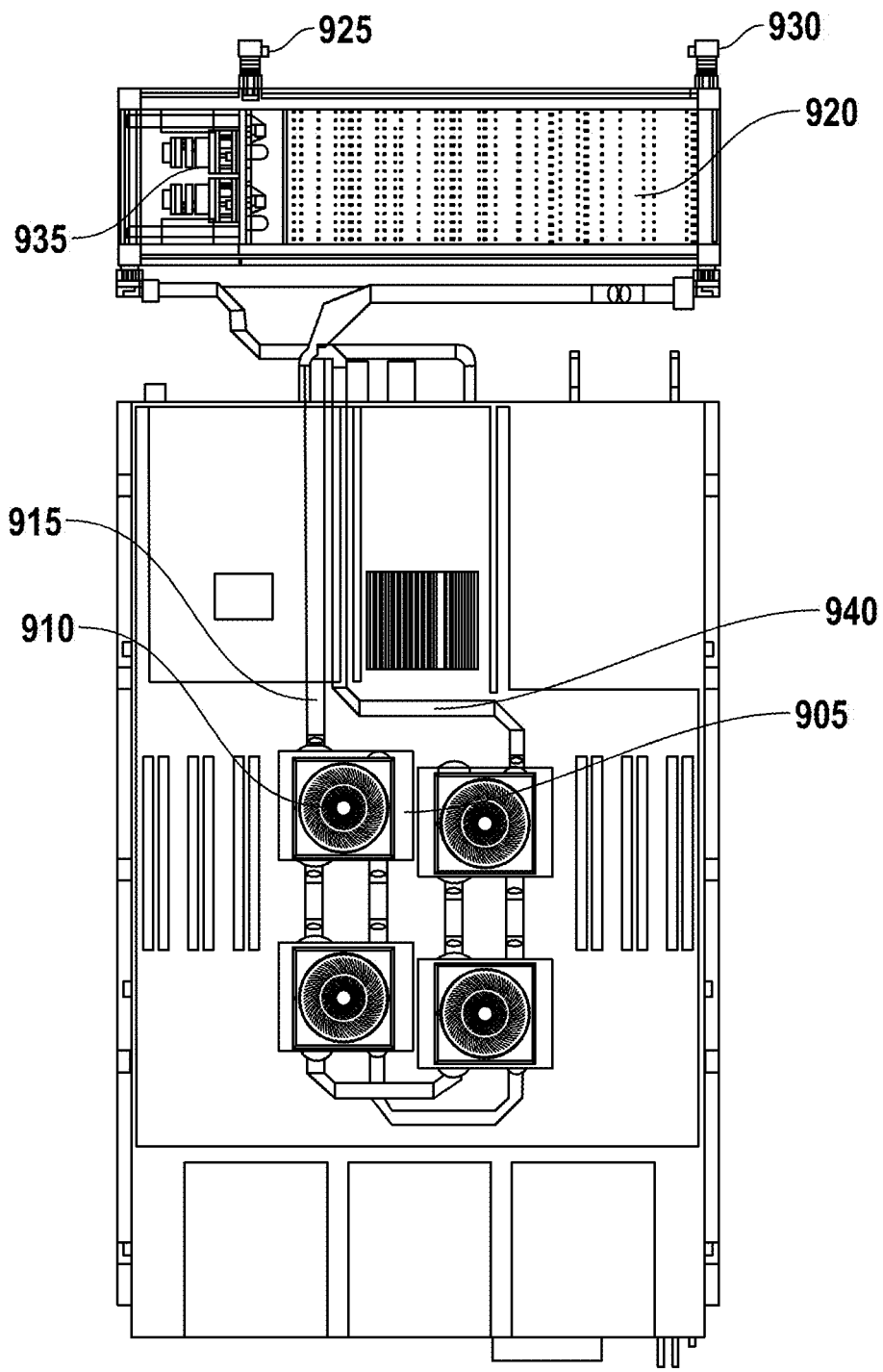
FIG. 9 illustrates an exemplary microchannel heat sink integrated within a server, in accordance with an embodiment of the present invention.

FIG. 9 illustrates an exemplary microchannel heat sink integrated within a server, in accordance with an embodiment of the present invention. Heat flux generated by heat sources 905 may be transferred to microchannel heat sinks 910 through the first layer and the second layer. Each microchannel heat sinks 910 may be tightly mounted to heat sources 905, and the center of each microchannel heat sink 910 may be centered on a local hot spot of each heat source 905 such that the local area may receive a majority of coolant fluid. The clod liquid may be pumped into microchannel heat sink 905 through liquid supply hose 915 and, after absorbing thermal energy from heat sources 905, may be pumped to heat exchanger 920. Heat in heat exchanger 920 may be dissipated using a fluid circulated from coolant inlet 925 to coolant outlet 930 using pump 935, and vapor may return through vapor return hose 940.

Figure 10A:
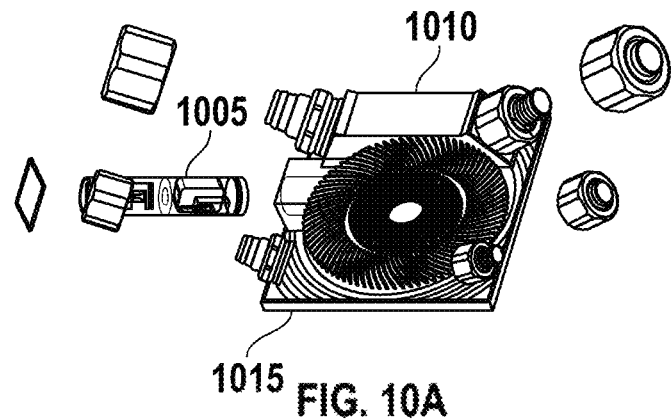
Figure 10B:
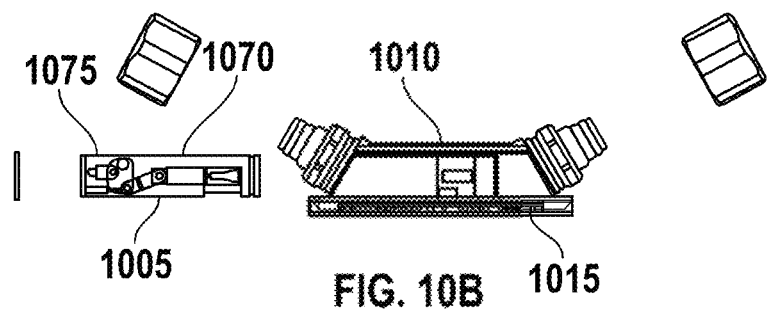
Figure 10C:
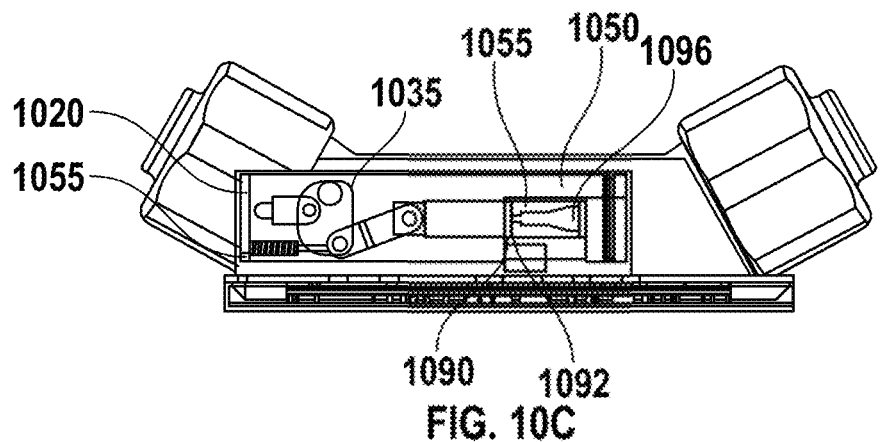
Figure 10D:
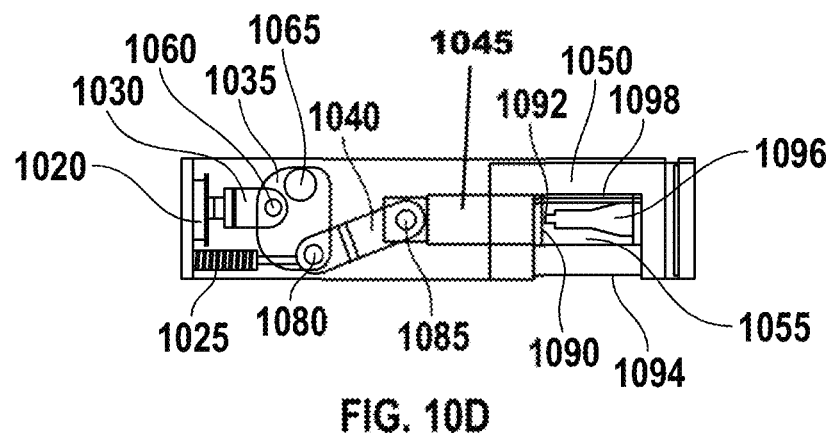

FIGS. 10A-10D illustrate an exemplary microchannel heat sink device with an incorporated diaphragm, wherein FIG. 10A shows an exploded view of a microchannel heat sink, FIG. 10B shows a side view of a microchannel heat sink, FIG. 10C shows a cross-sectional view of a microchannel heat sink, and FIG. 10D shows a thermal regulation valve (TRV), in accordance with an embodiment of the present invention. The volume ration between a bellow and a sensing chamber may determine the reposing speed of a TRV. The larger the bellow volume, the slower the response from the TRV. Additionally, condensation may occur in a bellow. As vapor temperature in the bellow may be lower than the preset temperature of the heat sink, the vapor in the sensing chamber may be condensed in the bellow. As such, the liquid in the sensing chamber may immigrate to the internal volume of the bellow. Without liquid in the sensing chamber adjacent to the heat sources, the TRV may not function efficiently. As such, a column may be inserted into the bellow to utilize the internal volume of the bellow. Alternatively, a diaphragm may be used to replace the bellow. Although the absolute displacement provided by a diaphragm may be limited when compared to the required valve stroke (e.g., 5 mm). As such, a mechanical amplifier may be used to enlarge generic displacement ranges of diaphragms from 0-1 mm to 0-5 mm as a complete valve stroke.

In comparison to the design shown in FIG. 1 and FIGS. 2A-2C, heat sink 1000 may utilize TRV 1005 which utilizes diaphragm 1020 instead of a bellow-based design. Cover 1010 and microchannel sublayers 1015 may be substantially similar to the design shown in FIG. 1 and FIGS. 2A-2C.

TRV 1010 may include diaphragm 1020, spring 1025, push rod 1030, lever 1035, connection rod 1040, sliding block rod 1045, valve block 1050, and sliding block 1055. Diaphragm 1020 may generate axial displacement when the fluid in the sensing chambers has been heated. Because of the limited deflections of diaphragms, the displacement may be amplified by a lever mechanism formed from push rod 1030, lever 1035, and connection rod 1040. The amplifying ration of diaphragms to a piston axial displacement may depend on the ratio of force arm between the pushing force of diaphragm 1020 with the ax of push rod 1030 and the force in connection rod 1040, and the angle between connection rod 1040 and sliding block rod 1045. Spring 1025 may keep push rod 1030 in close contact with the surface of diaphragm 1020 and may provide a preset superheat. Pin 1060 of the pivot hinge may join push rod 1030 and lever 1035. Pin 1065 of the pivot hinge may join lever 1035 and shell 1070 through hole 1075. Pin 1080 of the pivot hinge may join push rod 1030 and lever 1035. Pin 1085 of the pivot hinge may join connection rod 1040 and sliding block rod 1045. By this mechanism, the deflection from diaphragm 1020 may be amplified and transferred to the axial displacement of sliding block rod 1045. The flow regulation mechanism between valve block 1050 and sliding block 1055 may be substantially the same as the design shown in FIG. 1 and FIGS. 2A-2C. When sliding block 1055 is pushed forward, surface 1090 may move and pass left edge 1092 of inflow port 1096 of valve block 1050, and the valve may be open. The flow may go to outflow port 1094 of valve block 1050 through the area formed by surface 1090 and the edges of inflow port 1096. Chamber 1098 may be interior to TRV 1005.

Figure 11C:
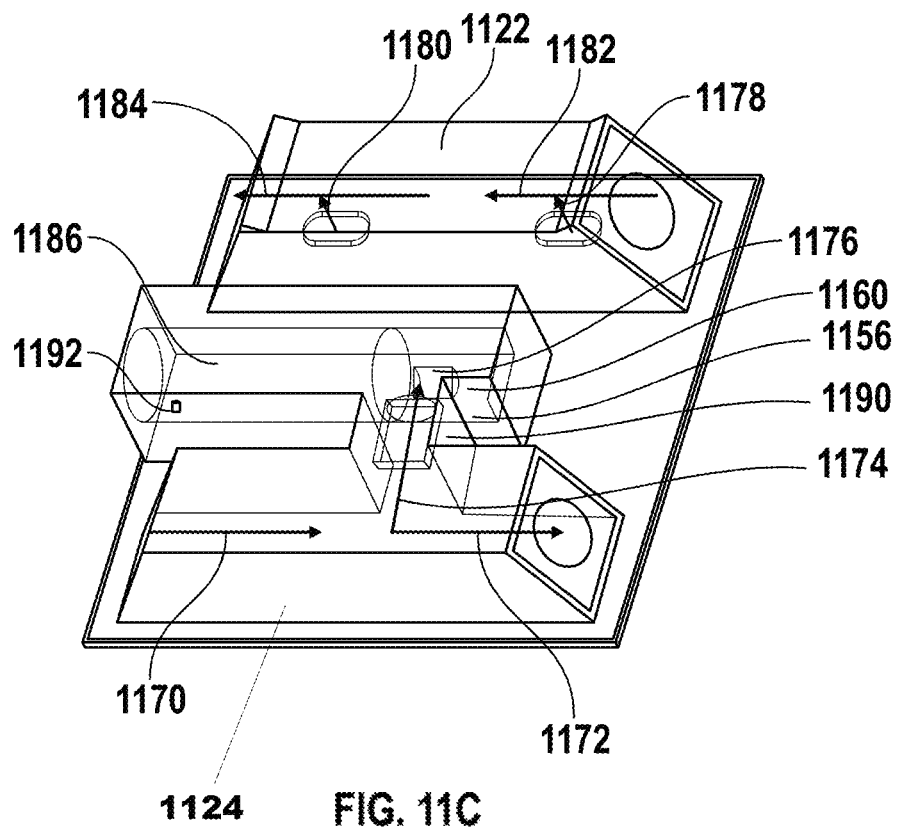
Figure 11D:
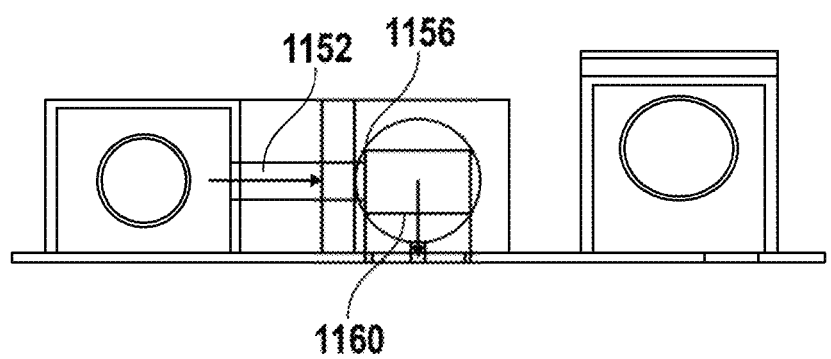

FIGS. 11A-11D illustrate an exemplary heat sink with an external sliding block, wherein FIG. 11A shows an exploded view of a heat sink with an external sliding block, FIG. 11B shows an exploded view of a thermal regulation valve (TRV), FIG. 11C shows a prospective view of a cover, and FIG. 11D shows a side view of a cover, in accordance with an embodiment of the present invention. Microchannel layers 1102, vapor-in fitting 1104, vapor-in adaptor 1106, vapor-out fitting 1108, vapor-out adaptor 1110, blind plate 1112, liquid-in fitting 1114, liquid-in adaptor 1116, liquid-out fitting 1118, liquid-out adaptor 1120, liquid channel 1122, and vapor channel 1124 may be substantially similar to the design shown in FIGS. 2A-2C. However, TRV 1126 may be simpler than the previous design. TRV 1126 may include rod 1128, bellow 1130, end plate 1132, valve block 1134, sliding block 1136, and shell 1138.

The components of TRV 1126 may be installed along the axis of shell 1138. Bellow 1130 may have a maximum axial deflection of 4-5 mm, with as small a diameter as possible (i.e., preferably less than 0.5") to fit within the height limitation of heat sink 1100. Bellow 1130 may work under a certain internal pressure, depending on the type of gas to be charged, for a certain number of cycles. End plate 1132 may be used to seal one end of bellow 1130, on which ventilation hole 1140 may reside. The opposite end of bellow 1132 may be brazed with rod 1128. Rod 1128 may be inserted into bellow 1132 and take up a portion of the internal volume of bellow 1132, and may improve the sensitivity of TRV 1126 to temperature variations. Spring 1142 may be installed on rod 1128, and may be used to adjust the superheat above an initial charging level. Valve block 1134 may be solidly mounted to shell 1138. Groove 1194 may be closely clamped with ventilation hole 1140 on groove 1196 of valve block 1134.

The force from spring 1142 against left valve block plane 1144 may be applied on bellow 1130, and may impact the superheat of TRV 1126. Rod 1128 may go through hole 1146 and connect to sliding block 1136. The initial position of sliding block 1136 may be the position wherein left sliding block plane 1150 is attached to right valve block plane 1148. Sliding block 1136 may be pushed by rod 1128 in an axial direction inside valve head chamber 1152. Front sliding block plane 1154 may contact inflow port surface 1156 and bottom sliding block plane 1158 may contact outflow port surface 1160. Valve block 1134 may slide in valve head chamber 1152 axially. In the initial position, front sliding block plane 1154 may completely block liquid-in valve 1162 completely. Because of the seal between front sliding block plane 1154 and inflow port surface 1156, no liquid may flow in liquid-in valve to liquid-out valve 1164. When bellow 1130 is expanded, rod 1128 may push sliding block 1136 forward. As a result, right valve block plane 1148 may be detached from left sliding block plane 1150, and a gap may form between them. The gap may be connected to liquid-out valve 1164. Simultaneously, because of the sliding movement, front sliding block plane 1154 may shift from the initial position to a new position, and front sliding block plane may not fully cover inflow port surface 1156. A portion of inflow port 1156 may form an opening to allow fluid to flow through. The axial movement of sliding block 1136 may determine the opening of the valve. The profile of the opening, in this case, may be rectangular, but different flow areas may be achieved per unit of axial displacement by different axial profiles.

Notch 1166 of shell 1138 may correspond to a ventilation hole, allowing pressure from the sensing chambers to be transferred to the bellow through the ventilation hole. Rod 1128 may be composed of metals, such as, without limitation, copper, steel, etc. Additionally, valve block 1134 and sliding block 1136 may be plastic materials with a low friction factor, such as, without limitation, PTFE, nylon, etc. The entirety of TRV 1126 may be manufactured and assembled separately, and attached to heat sink 1100 as a subassembly.

Cover 1168 may be manufactured separately or printed together with microchannel layers 1102. The top of cover 1168 may include liquid channels, vapor channels, and a chamber for TRV 1126. Liquid in direction 1170 in liquid channel 1124 may be divided into first stream 1172 and second stream 1174. Second stream 1174 may flow through TRV 1126 and into the liquid inlet in direction 1176. First stream 1176 may flow continuously out of the current heat sink and into a downstream heat sink. The flow in direction 1176 may be evaporated in microchannel layers 1102 and become vapor exiting through vapor outlet ports in directions 1178 and 1180. The flow in directions 1178 and 1180 may join with vapor from an upstream heat sink through vapor-in flow 1182 and exit heat sink 1100 in direction 1184. Wall 1186 of regulation valve chamber 1188 may be of various different profiles. Channel 1190 may be fluidly connected with liquid channel 1124 and regulation valve chamber 1188, and the cross section of channel 1190 may be rotund, rectangular, or other shapes as long as there are no significant pressure drops. Inflow port surface 1156 may contact front sliding block plane 1154 and form a fluid seal. Outlet port surface 1160 may make contact with back sliding block plane 1158 to form another fluid seal. Ventilation hole 1192 may be connected to another ventilation hole to ensure pressure variation may be applied to bellow 1130.

All the features disclosed in this specification, including any accompanying abstract and drawings, may be replaced by alternative features serving the same, equivalent, or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(0) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 USC § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing a microchannel heat sink according to the present invention will be apparent to those skilled in the art. Various aspects of the invention have been described above by way of illustration, and the specific embodiments disclosed are not intended to limit the invention to the particular forms disclosed. The particular implementation of the microchannel heat sink may vary depending upon the particular context or application. By way of example, and not limitation, the microchannel heat sink described in the foregoing were principally directed to electronics device cooling implementations including computing devices, variable speed driver, communication devices, etc; however, similar techniques may instead be applied to vehicular electronics cooling, Bit coin mining equipment cooling, Laser/optical device cooling, Electromagnetic wave generators cooling and so on, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

Only those claims which employ the words "means for" or "steps for" are to be interpreted under 35 USC 112, sixth paragraph (pre-AIA) or 35 USC 112(f) post-AIA. Otherwise, no limitations from the specification are to be read into any claims, unless those limitations are expressly included in the claims.

What is claimed is:

1. A device comprising:
a microchannel heat sink, in which said microchannel heat sink comprises:
  a liquid inlet, wherein a coolant fluid is introduced into said microchannel heat sink through said liquid inlet;
  a first layer (L1) circle A fins, wherein L1 circle A fins comprise a plurality of first layer (L1) outer ring fins;
  a first layer (L1) circle B fins, wherein L1 circle B fins comprise a plurality of first layer (L1) inner ring fins;
  an L1 central flow channel, wherein said L1 central flow channel is configured to form an inlet plenum for coolant fluid impingement and distribution;
  an L1 circle B radial flow channels inlet that is disposed around said L1 central flow channel where coolant fluid impingement and distribution occur;
  an L1 circle B radial flow channels outlet where the coolant fluid flow outwardly from said L1 circle B radial flow channels inlet towards said L1 circle B radial flow channels outlet;
  a second layer (L2) circle A fins, wherein L2 circle A fins comprise a plurality of second layer (L2) outer ring fins; and
  a second layer (L1) circle B fins, wherein L2 circle B fins comprise a plurality of second layer (L2) inner ring fins;
a cover assembly, in which said cover assembly comprise at least a first adaptor with a first fitting, wherein said microchannel heat sink is into engagement with a coolant fluid supply through said first adaptor and first fitting;
a thermal regulation valve (TRV), wherein said thermal regulation valve (TRV) is configured to enable dynamic responses for temperature control in said microchannel heat sink; and
a temperature sensing mechanism, in which said temperature sensing mechanism is configured to be operable for detecting temperature variations and converting the temperature variations to pressure variations.

2. The device of claim 1, in which said microchannel heat sink further comprise:
an L2 central flow channel, wherein said L2 central flow channel is configured to form an inlet plenum for coolant fluid impingement and distribution;
an L2 circle B radial flow channels inlet that is disposed around said L2 central flow channel where coolant fluid impingement and distribution occur; and
an L2 circle B radial flow channels outlet where the coolant fluid flow outwardly from said L2 circle B radial flow channels inlet towards said L2 circle B radial flow channels outlet.

3. The device of claim 2, in which said microchannel heat sink further comprise:
an L1 base plate;
an L1 circle B fins walls;
an L1 circle A fins walls;
an L2 bottom surface; and
wherein said L1 base plate, said walls of L1 circle B fins and L1 circle A fins, and L2 bottom surface are configured to form a first microchannel flow path of said first layer (L1).

4. The device of claim 3, in which said microchannel heat sink further comprise:
an L2 base plate;
an L2 circle B fins walls;
an L2 circle A fins walls;
an L2 bottom surface; and
wherein said L2 base plate, said walls of L2 circle B fins and L2 circle A fins, and L2 bottom surface are configured to form a second microchannel flow path of said second layer (L2).

5. The device of claim 1, in which said microchannel heat sink further comprise:
a microchannel heat sink cover bottom surface;
an L2 fins top surface; and
wherein said microchannel heat sink cover bottom surface is brazed or machined configured to be into engagement with said L2 fins top surface.

6. The device of claim 1, in which said microchannel heat sink further comprise:
an L2 bottom surface;
an L1 fins top surface; and
wherein said L2 bottom surface is brazed or machined configured to be part of said L1 fins top surface.

7. The device of claim 1, in which said microchannel heat sink further comprise:
a frame;
an L1 base plate;
an L2 base plate;
a microchannel heat sink cover, in which said microchannel heat sink cover having a first vapor outlet, a second vapor outlet, and said liquid inlet; and
wherein said frame, L1 base plate, L2 base plate, microchannel heat sink cover, first layer L1, and second layer L2 are made of a thermally conductive material that is operable for the transfer of thermal energy from said microchannel heat sink to the coolant fluid.

8. The device of claim 1, in which said cover assembly further comprise:
a second adapter with a second fitting;
a third adapter and third fitting; and
a fourth adapter and fourth fitting.

9. The device of claim 1, in which said cover assembly further comprise:
a regulation valve chamber;
a liquid channel; and
a vapor channel.

10. The device of claim 9, in which said cover assembly further comprise:
a connecting channel;
a port;
wherein said connecting channel is into engagement with said liquid channel and regulation valve chamber; and
wherein said port is an exit port of channel to said regulation valve chamber.

11. The device of claim 1, in which said thermal regulation valve comprise:
a sensing bulb;
a capillary tube;
a bellow;
a valve head;
an installation plate; and
an installation hole that is configured to receive said installation plate.

12. The device of claim 1, in which said temperature sensing mechanism comprises at least one of, a temperature sensing bulb and a temperature sensing chamber.

13. The device of claim 1, further comprise:
a thermal regulation valve (TRV) insert;
a thermal regulation valve chamber; and
wherein said thermal regulation valve (TRV) insert is housed in said thermal regulation valve chamber.

14. The device of claim 13, further comprise:
a blind plate;
a thermal regulation valve chamber wall; and
wherein said blind plate is brazed or bolted to the wall of said thermal regulation valve chamber.

15. The device of claim 1, in which said thermal regulation valve (TRV) comprise:
a shell;
a sliding block;
a valve block;
a spring; and
a bellow subassembly.

16. The device of claim 1, in which said thermal regulation valve (TRV) comprise:
a diaphragm;
a spring;
a push rod;
a lever;
a connection rod;
a sliding block rod;
a valve block, and
a sliding blocks.

17. The device of claim 1, in which said thermal regulation valve (TRV) comprise:
a rod;
a bellow;
an end plate;
a valve block;
a sliding block; and
a shell.

18. A device comprising:
means for transferring heat from a heat source to a coolant fluid;
means for forming a first microchannel flow path;
means for forming a second microchannel flow path;
means for covering said heat transferring means;
means for enabling dynamic responses for temperature control in said heat transferring means;
means for detecting temperature variations in said heat transferring means; and
means for converting temperature variations to pressure variations in said dynamic response enabling means.

19. A device comprising:
a microchannel heat sink, in which said microchannel heat sink comprises:
 a microchannel heat sink cover having a liquid inlet, wherein a coolant fluid that is configured to lower temperature is introduced into said microchannel heat sink through said liquid inlet;
 a first layer (L1) circle A fins, wherein L1 circle A fins comprise a plurality of first layer (L1) outer ring fins;
 a first layer (L1) circle B fins, wherein L1 circle B fins comprise a plurality of first layer (L1) inner ring fins;
 a second layer (L2) circle A fins, wherein L2 circle A fins comprise a plurality of second layer (L2) outer ring fins;
 a second layer (L1) circle B fins, wherein L2 circle B fins comprise a plurality of second layer (L2) inner ring fins;
a cover assembly, in which said cover assembly comprise at least a first adaptor with a first fitting, wherein said microchannel heat sink is into engagement with a coolant fluid supply through said first adaptor and first fitting;
a thermal regulation valve (TRV) disposed in said cover assembly, wherein said thermal regulation valve (TRV) is configured to enable dynamic responses for temperature control in said microchannel heat sink, said thermal regulation valve (TRV) comprise:
 a shell;
 a sliding block;
 a valve block;
 a spring; and
 a bellow subassembly;
and
a temperature sensing mechanism, wherein said temperature sensing mechanism is configured to detect temperature variations in said microchannel heat sink, and wherein said temperature sensing mechanism is further configured to be operable for converting the detected temperature variations to pressure variations in said thermal regulation valve (TRV).

20. A device comprising:
a microchannel heat sink, in which said microchannel heat sink comprises:
 a microchannel heat sink cover having a liquid inlet, wherein a coolant fluid is introduced into said microchannel heat sink through said liquid inlet;
 a first microchannel layer (L1) having a first segment and a second segment, said first segment including circle A and said second segment including circle B;
 a first microchannel layer (L1) circle A fins, wherein L1 circle A fins comprise a plurality of first layer (L1) outer ring fins;
 a first microchannel layer (L1) circle B fins, wherein L1 circle B fins comprise a plurality of first layer (L1) inner ring fins;
 an L1 central flow channel, wherein said L1 central flow channel is configured to form an inlet plenum for coolant fluid impingement and distribution;
 an L1 circle B radial flow channels inlet that is disposed around said L1 central flow channel where coolant fluid impingement and distribution occur;
 an L1 circle B radial flow channels outlet where the coolant fluid flow outwardly from said L1 circle B radial flow channels inlet towards said L1 circle B radial flow channels outlet;
 a second microchannel layer (L2) having a first segment and a second segment, said first segment including circle A and said second segment including circle B;
 a second microchannel layer (L2) circle A fins, wherein L2 circle A fins comprise a plurality of second layer (L2) outer ring fins;
 a second microchannel (L1) circle B fins, wherein L2 circle B fins comprise a plurality of second layer (L2) inner ring fins;
a thermal regulation valve (TRV), wherein said thermal regulation valve (TRV) is configured to enable dynamic responses for temperature control in said microchannel heat sink;
a cover assembly:
and
a temperature sensing chamber, wherein said temperature sensing chamber is configured to detect temperature variations in said microchannel heat sink, and wherein said temperature sensing chamber is further configured to be operable for converting the detected temperature variations to pressure variations.

\* \* \* \* \*